United States Patent
Yeom

(10) Patent No.: US 8,569,860 B2
(45) Date of Patent: Oct. 29, 2013

(54) SEMICONDUCTOR DEVICES HAVING LINE TYPE ACTIVE REGIONS AND METHODS OF FABRICATING THE SAME

(75) Inventor: Kye-Hee Yeom, Suwon-si (KR)

(73) Assignee: Samsung Electronics Co., Ltd. (KR)

(*) Notice: Subject to any disclaimer, the term of this patent is extended or adjusted under 35 U.S.C. 154(b) by 14 days.

(21) Appl. No.: 12/905,614

(22) Filed: Oct. 15, 2010

(65) Prior Publication Data

US 2011/0031539 A1 Feb. 10, 2011

Related U.S. Application Data

(62) Division of application No. 12/486,438, filed on Jun. 17, 2009, now Pat. No. 7,829,959, which is a division of application No. 11/353,494, filed on Feb. 14, 2006, now Pat. No. 7,563,699.

(30) Foreign Application Priority Data

Mar. 3, 2005 (KR) .................. 10-2005-0017872

(51) Int. Cl.
H01L 21/70 (2006.01)
(52) U.S. Cl.
USPC ........... 257/508; 257/394; 257/401; 257/506; 257/E27.105; 257/E27.107
(58) Field of Classification Search
USPC .................. 257/390, 394, 401, 408, 506, 508, 257/E27.107, E27.105; 438/176, 283, 589
See application file for complete search history.

(56) References Cited

U.S. PATENT DOCUMENTS

| | | | |
|---|---|---|---|
| 5,488,249 A * | 1/1996 | Crafts | 257/401 |
| 6,025,221 A | 2/2000 | Brown | |
| 6,063,669 A * | 5/2000 | Takaishi | 438/270 |
| 6,297,129 B2 | 10/2001 | Tran et al. | |
| 6,300,655 B1 * | 10/2001 | Ema et al. | 257/306 |
| 6,362,501 B1 | 3/2002 | Kim | |
| 6,462,368 B2 * | 10/2002 | Torii et al. | 257/295 |

(Continued)

FOREIGN PATENT DOCUMENTS

| | | |
|---|---|---|
| KR | 10-2000-0074103 | 12/2000 |
| KR | 10-2004-0008424 | 1/2004 |
| KR | 10-2005-0017872 | 2/2005 |

OTHER PUBLICATIONS

Application and Prosecution history of U.S. Appl. No. 11/353,494, filed Feb. 14, 2006, by Kye-Hee Yeom, Entitled "Semiconductor Devices Having Line Type Active Regions and Methods of Fabricating the Same".

(Continued)

*Primary Examiner* — Eduardo A Rodela
(74) *Attorney, Agent, or Firm* — Onello & Mello, LLP

(57) ABSTRACT

In a semiconductor device having line type active regions and a method of fabricating the semiconductor device, the semiconductor device includes a device isolation layer which defines the line type active regions in a in a semiconductor substrate. Gate electrodes which are parallel to each other and intersect the line type active regions are disposed over the semiconductor substrate. Here, the gate electrodes include both a device gate electrode and a recessed device isolation gate electrode. Alternatively, each of the gate electrodes is constituted of a device gate electrode and a planar type device isolation gate electrode, and a width of the planar type device isolation gate electrode greater than a width of the device gate electrode.

12 Claims, 24 Drawing Sheets

(56) References Cited

U.S. PATENT DOCUMENTS

| | | | |
|---|---|---|---|
| 7,091,540 B2* | 8/2006 | Kim et al. | 257/296 |
| 7,339,221 B2* | 3/2008 | Shiratake | 257/296 |
| 7,358,144 B2* | 4/2008 | Im | 438/296 |
| 7,563,699 B2 | 7/2009 | Yeom | |
| 7,872,290 B2* | 1/2011 | Kim et al. | 257/300 |
| 7,923,784 B2* | 4/2011 | Chae et al. | 257/368 |
| 2001/0025973 A1* | 10/2001 | Yamada et al. | 257/296 |
| 2003/0011032 A1* | 1/2003 | Umebayashi | 257/368 |
| 2004/0195608 A1* | 10/2004 | Kim et al. | 257/296 |
| 2005/0077560 A1 | 4/2005 | Shiratake | |
| 2005/0136616 A1 | 6/2005 | Cho et al. | |
| 2005/0173744 A1 | 8/2005 | Kim et al. | |
| 2005/0173759 A1 | 8/2005 | Kim et al. | |

OTHER PUBLICATIONS

Application and Prosecution history of U.S. Appl. No. 12/486,438, filed Jun. 17, 2009, by Kye-Hee Yeom, Entitled "Semiconductor Devices Having Line Type Active Regions and Methods of Fabricating the Same".

* cited by examiner

SEMICONDUCTOR DEVICES HAVING LINE TYPE ACTIVE REGIONS AND METHODS OF FABRICATING THE SAME

CROSS-REFERENCE TO RELATED PATENT APPLICATION

This application is a divisional application of U.S. patent application Ser. No. 12/486,438, filed on Jun. 17, 2009, now U.S. Pat. No. 7,829,959, which is a divisional of U.S. patent application Ser. No. 11/353,494, filed on Feb. 14, 2006, now U.S. Pat. No. 7,563,699, which claims the benefit of Korean patent application number 10-2005-0017872, filed on Mar. 3, 2005, in the Korean Intellectual Property Office, the contents of which applications are incorporated herein in their entirety by reference.

BACKGROUND OF THE INVENTION

1. Field of the Invention

The present invention relates to semiconductor devices and methods of fabricating the same, and more particularly, to semiconductor devices having line type active regions and methods of fabricating the same.

2. Description of Related Art

As the integration degree of semiconductor memory devices such as DRAM devices continues to increase, the area available to memory devices integrated on a wafer is reduced, and the areas occupied by transistors and capacitors are also reduced according to a predetermined ratio. A basic component of semiconductor memory devices is the memory cell, in which a single bit of information can be stored. The DRAM device comprises a plurality of cells, each having one transistor and one capacitor, and peripheral circuits which can perform read and write operations in order to store information in the cells and retrieve information from the cells.

A conventional DRAM cell array has island type active regions. As the integration degree of the memory device increases, areas of the island type active regions accommodating individual transistors are also reduced. Therefore, although a mask design may have the shape of a rectangle, the active regions actually defined on a substrate have a rounded shape, approximately the shape of a circle due to technical limitations in the photolithography and etching processes. In addition, as areas of interconnections and capacitors connected to the island type active regions become further reduced, misalignment such as over-contact occurs, causing a reduction in device fabrication yield and device reliability. In addition, as the active regions are defined with the island shape, areas occupied by device isolation regions which are required for insulation between the active regions are necessarily relatively large in the substrate, so that there is a limitation in the integration density of the devices.

Therefore, there has been proposed a method of electrically isolating the cells by forming line type active regions, forming device gates and device isolation gates to intersect the line type active regions, and applying a voltage so as to prevent occurrence of current channels from forming under the device isolation gate. However, the method of isolating the devices by using the device isolation gates cannot effectively perform device isolation function in comparison to the method using the island type active regions. In addition, as the integration degree increases, a width of the gate is reduced, so that a device isolation gate function cannot be efficiently performed.

SUMMARY OF THE INVENTION

The present invention provides a semiconductor device suitable for using line type active regions and improving device isolation gate characteristics and a method of fabricating the same in manner that addresses the stated limitations in the conventional approaches.

According to an aspect of the present invention, there is provided a semiconductor device having line type active regions. The semiconductor device comprises a device isolation layer which defines the line type active regions in a semiconductor substrate. Gate electrodes which are parallel to each other and intersect the line type active regions are disposed over the semiconductor substrate. Here, the gate electrodes include both a device gate electrode and a recessed device isolation gate electrode.

Preferably, the device gate electrode is a planar type device gate electrode or a recessed device gate electrode. A width of the recessed device isolation gate electrode is equal to or larger than a width of the device gate electrode.

Preferably, an off bias is applied to the recessed device isolation gate electrode during operation to provide a device isolation function.

An intersection angle of the line type active regions and the gate electrodes may be in a range of 20° to 90°.

According to another aspect of the present invention, there is provided a semiconductor device having line type active regions. The semiconductor device comprises a device isolation layer which defines the line type active regions in a semiconductor substrate. Gate electrodes which are parallel to each other and intersect the line type active regions are disposed over the semiconductor substrate. Here, the gate electrodes include both a device gate electrode and a planar type device isolation gate electrode, and a width of the planar type device isolation gate electrode is disposed to be greater than a width of the device gate electrode.

The device gate electrode may be a planar type device gate electrode or a recessed device gate electrode.

Preferably, an off bias is applied to the planar type device isolation gate electrode during operation to provide a device isolation function.

An intersection angle of the line type active regions and the gate electrodes may be in a range of 20° to 90°.

According to another aspect of the present invention, there is provided a method of fabricating semiconductor device having line type active regions. The method comprises a step of forming a device isolation layer which defines the line type active regions in a semiconductor substrate, wherein active regions are formed to have a line type structure. Device gate channel trenches and device isolation gate channel trenches which are parallel to each other and intersect the line type active regions are formed in the semiconductor substrate. A conformal gate insulating layer is formed on inner surfaces of the device gate channel trenches and the device isolation gate channel trenches. Recessed device gate electrodes filling the device gate channel trenches and recessed device isolation gate electrodes filling the device isolation gate channel trenches are formed on the semiconductor substrate having the gate insulating layer.

Preferably, a width of the recessed device isolation gate electrode is equal to or greater than a width of the recessed device gate electrode.

Preferably, an off bias is applied to the recessed device isolation gate electrode during operation to provide a device isolation function.

The line type active regions and the gate electrodes may be formed to have an intersection angle of 20° to 90°.

According to still another aspect of the present invention, there is provided a method of fabricating semiconductor device having line type active regions. The method comprises a step of forming a device isolation layer which defines the line type active regions in a semiconductor substrate, wherein the active regions are formed to have a line type structure. Channel trenches which intersect the line type active regions are formed in the semiconductor substrate. A conformal gate insulating layer is formed on top surfaces of the line type active regions and inner surfaces of the channel trenches. Recessed device isolation gate electrodes filling the channel trenches and planar type device gate electrodes which are parallel to the recessed device isolation gate electrodes are formed on the semiconductor substrate having the gate insulating layer.

A width of the recessed device isolation gate electrode may be formed to be equal to or greater than a width of the planar type device gate electrode.

Preferably, an off bias is applied to the recessed device isolation gate electrode during operation to provide a device isolation function.

The line type active regions and the gate electrodes may be formed to have an intersection angle of 20° to 90°.

According to further still another aspect of the present invention, there is provided a method of fabricating semiconductor device having line type active regions. The method comprises a step of forming a device isolation layer which defines the line type active regions in a semiconductor substrate, wherein the active regions are formed to have a line type structure. A conformal gate insulating layer is formed on top surfaces of the line type active regions. Planar type device gate electrodes and planar type device isolation gate electrodes which are parallel to each other and intersect the line type active regions are formed on the semiconductor substrate having the gate insulating layer. Here, a width of the planar type device isolation gate electrode is formed to be greater than a width of the planar type device gate electrode.

Preferably, an off bias is applied to the planar type device isolation gate electrode during operation to provide a device isolation function.

The line type active regions and the gate electrodes may be formed to have an intersection angle of 20° to 90°.

According to further still another aspect of the present invention, there is provided a method of fabricating semiconductor device having line type active regions. The method comprises a step of forming a device isolation layer which defines the line type active regions in a semiconductor substrate, wherein the active regions are formed to have a line type structure. Channel trenches which intersect the line type active regions are formed in the semiconductor substrate. A conformal gate insulating layer is formed on top surfaces of the line type active regions and inner surfaces of the channel trenches. Recessed device gate electrodes filling the channel trenches and planar type device isolation gate electrodes which are parallel to the recessed device gate electrodes are formed on the semiconductor substrate having the gate insulating layer. Here, a width of the planar type device isolation gate electrode is formed to be greater than a width of the recessed device gate electrode.

Preferably, an off bias is applied to the planar type device isolation gate electrode during operation to provide a device isolation function.

The line type active regions and the gate electrodes may be formed to have an intersection angle of 20° to 90°.

BRIEF DESCRIPTION OF THE DRAWINGS

The above and other features and advantages of the present invention will become more apparent by describing in detail exemplary embodiments thereof with reference to the attached drawings in which:

FIGS. 1A to 3A are plan views for illustrating a semiconductor device fabricating method according to an embodiment of the present invention;

FIGS. 1B to 3B are cross sectional views taken along section line I-I' of FIGS. 1A to 3A;

FIGS. 1C to 3C are cross sectional views taken along section line II-II' of FIGS. 1A to 3A;

FIGS. 4A to 6A are plan views for explaining a semiconductor device fabricating method according to another embodiment of the present invention;

FIGS. 4B to 6B are cross sectional views taken along section line III-III' of FIGS. 4A to 6A;

FIGS. 4C to 6C are cross sectional views taken along section line IV-IV' of FIGS. 4A to 6A;

FIGS. 7A to 9A are plan views for illustrating a semiconductor device fabricating method according to still another embodiment of the present invention;

FIGS. 7B to 9B are cross sectional views taken along section line V-V' of FIGS. 7A to 9A;

FIGS. 7C to 9C are cross sectional views taken along section line VI-VI' of FIGS. 7A to 9A;

FIGS. 10A to 12A are plan views for illustrating a semiconductor device fabricating method according to further still another embodiment of the present invention;

FIGS. 10B to 12B are cross sectional views taken along section line VII-VII' of FIGS. 10A to 12A; and FIGS. 10C to 12C are cross sectional views taken along section line VIII-VIII' of FIGS. 10A to 12A.

DETAILED DESCRIPTION OF THE INVENTION

Figure 1A:
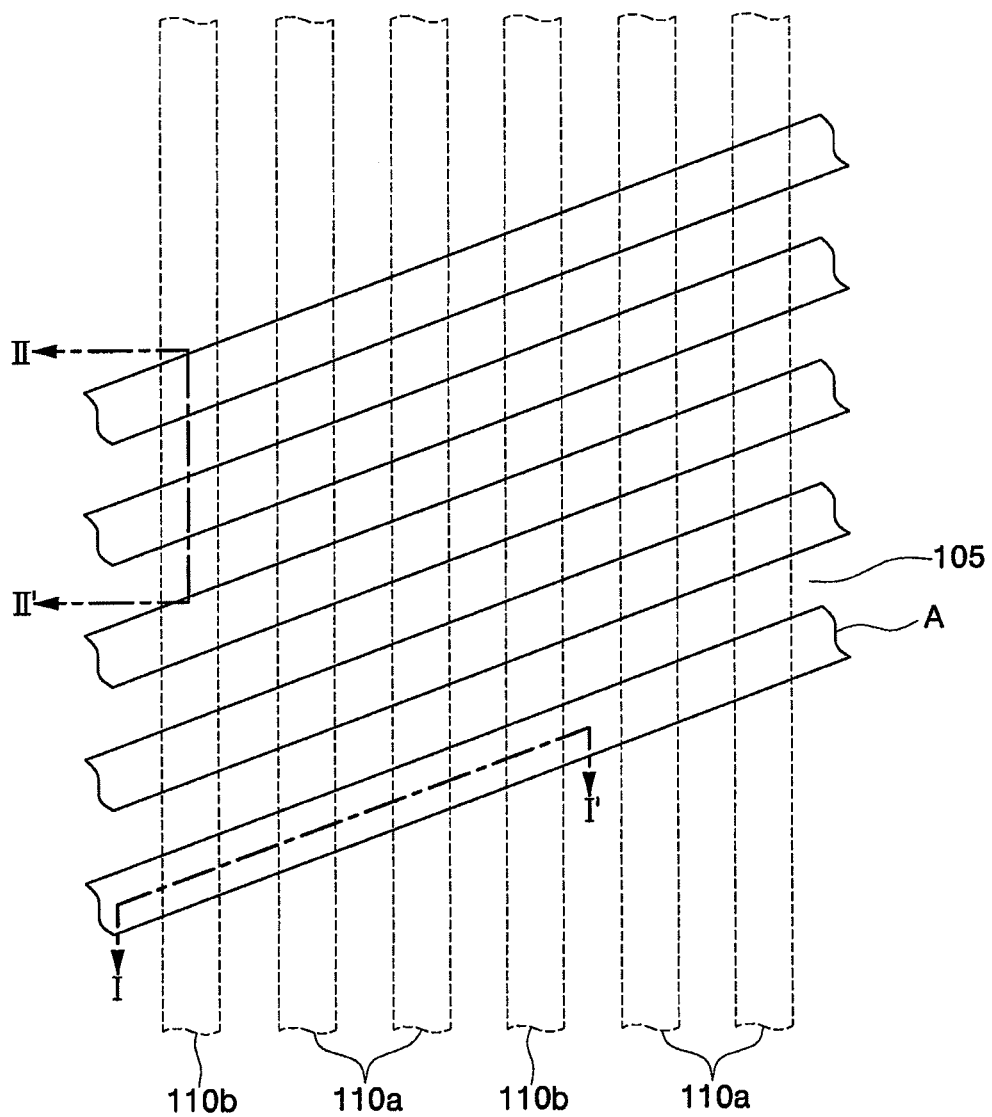

Now, exemplary embodiments of the present invention will be described in detail with reference to the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, lengths and thicknesses of layers and regions and regions may be exaggerated for clarity. Like reference numerals in the drawings denote like devices, and thus their description will be omitted.

In the present invention, 'device gate' denotes a gate fabricated to perform read and write operations of a device, and 'device isolation gate' denotes a gate fabricated for performing a function of a device isolation layer. In addition, 'recessed gate electrode' denotes a gate electrode formed over a recessed gate channel having a three-dimensional structure, and 'planar type gate electrode' denotes a gate electrode formed over a planar type gate channel having a general two-dimensional structure.

FIGS. 1A to 3A are plan views for illustrating a semiconductor device fabricating method according to an embodiment of the present invention.

FIGS. 1B to 3B are cross sectional views taken along section line I-I' of FIGS. 1A to 3A.

FIGS. 1C to 3C are cross sectional views taken along section line II-II' of FIGS. 1A to 3A.

Figure 1B:
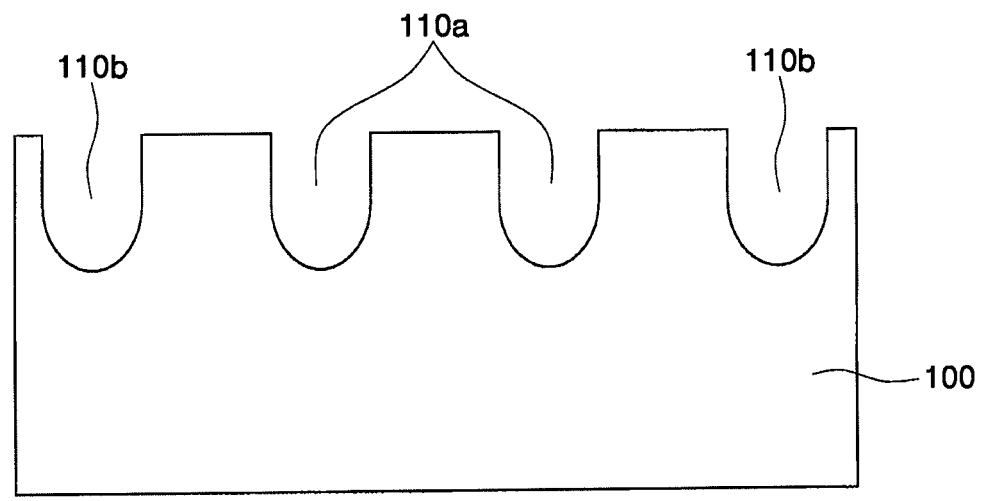
Figure 1C:
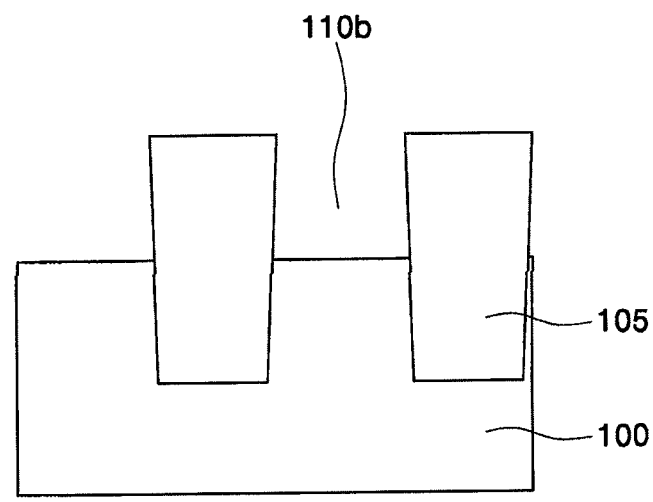

Referring to FIGS. 1A, 1B, and 1C, a device isolation layer 105 which defines active regions A is formed on an semiconductor substrate 100, and the active regions A are formed to have a line type structure. The device isolation layer 105 may be formed by using a shallow trench isolation (STI) process. A portion of the line type active regions A in the semiconductor substrate is etched to form device gate channel trenches 110a and device isolation gate channel trenches 110b which are parallel to each other. At the same time, a portion of a top surface of the device isolation layer 105 may be etched. The channel trenches 110a and 110b are formed to intersect the line type active regions A. Next, by using a wet rinsing process using a rinsing solution, that is, a mixture solution of NH$_4$OH, H$_2$O$_2$, and H$_2$O or a dry rinsing process using a chemical agent reacting with the semiconductor substrate 100, lower corners of the channel trenches 110a and 110b are optionally rounded.

Figure 2A:
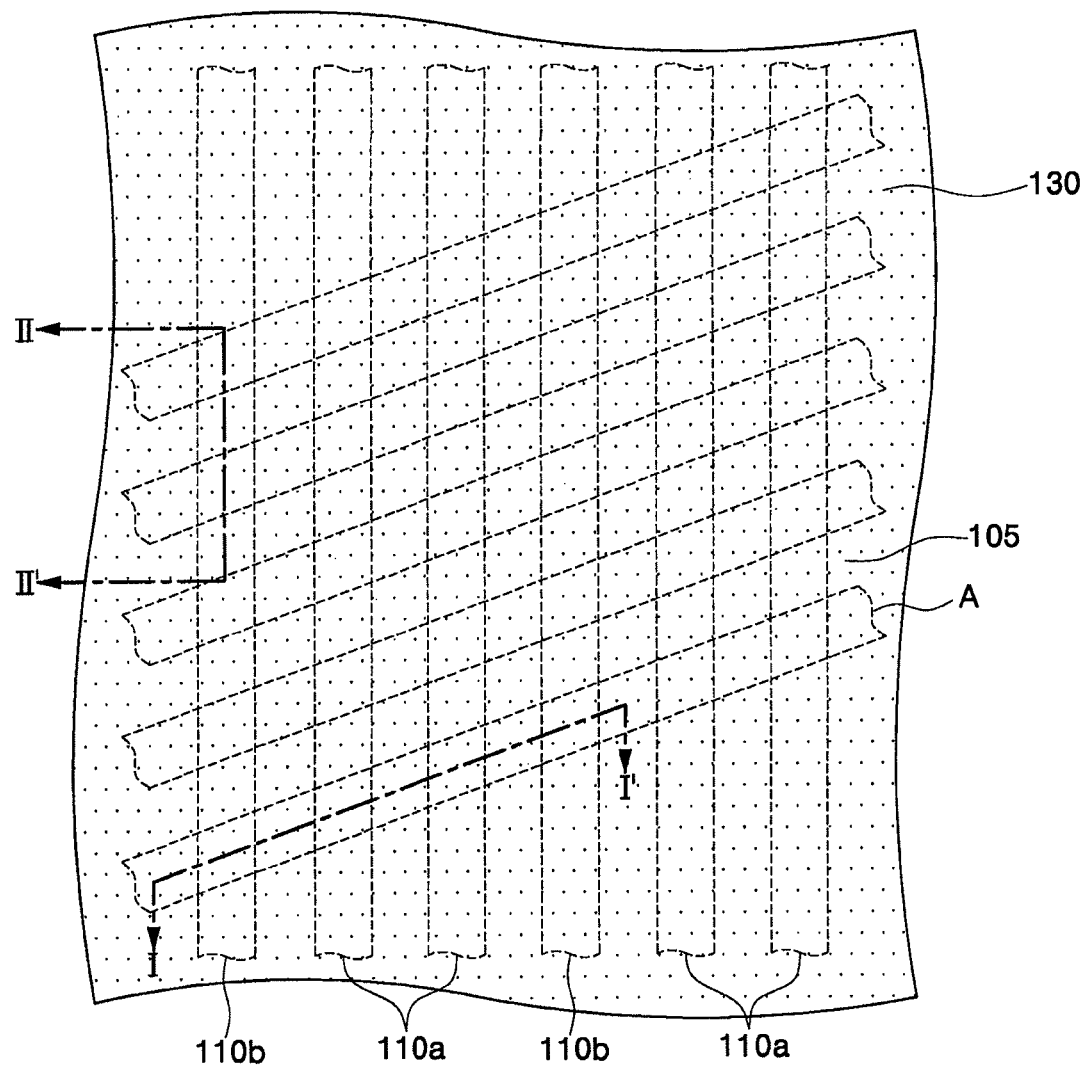
Figure 2B:
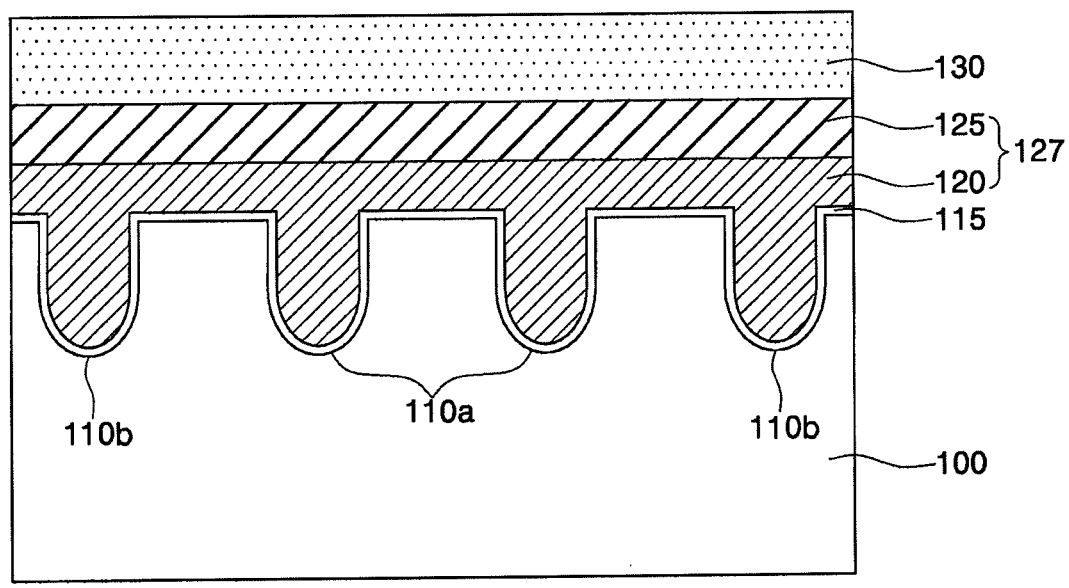
Figure 2C:
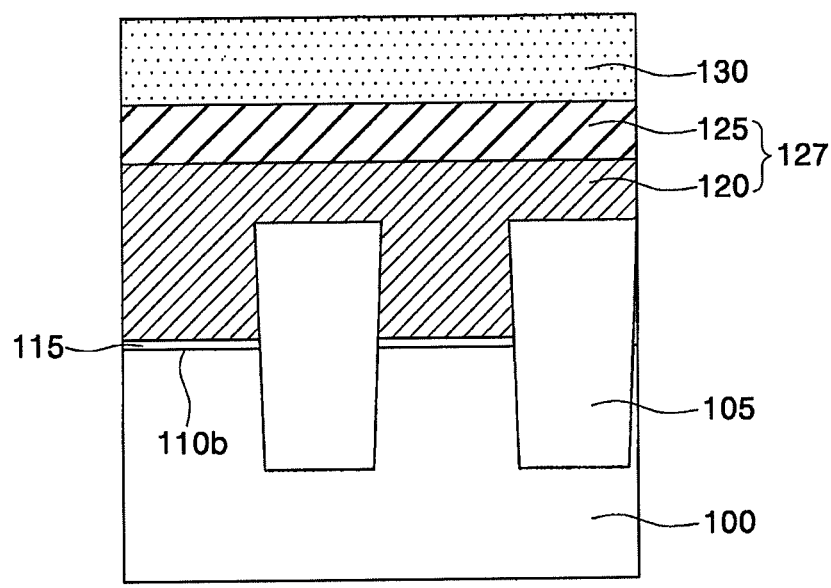

Referring to FIGS. 2A, 2B, and 2C, a conformal gate insulating layer 115 is formed on the semiconductor substrate on which the channel trenches 110a and 110b are formed. Preferably, the gate insulating layer 115 is formed by performing a thermal oxidation process on the semiconductor substrate. A gate electrode layer 127 filling the channel trenches 110a and 110b is formed on the semiconductor substrate having the gate insulating layer 115. The gate electrode layer 127 may be formed of a polysilicon layer 120 and a metal silicide layer 125 which are sequentially stacked. The metal silicide layer 125 may be formed of tungsten silicide (WSi). A hard mask layer 130 is formed on the gate electrode layer 127. The hard mask layer 130 may be formed of a silicon nitride layer.

Figure 3A:
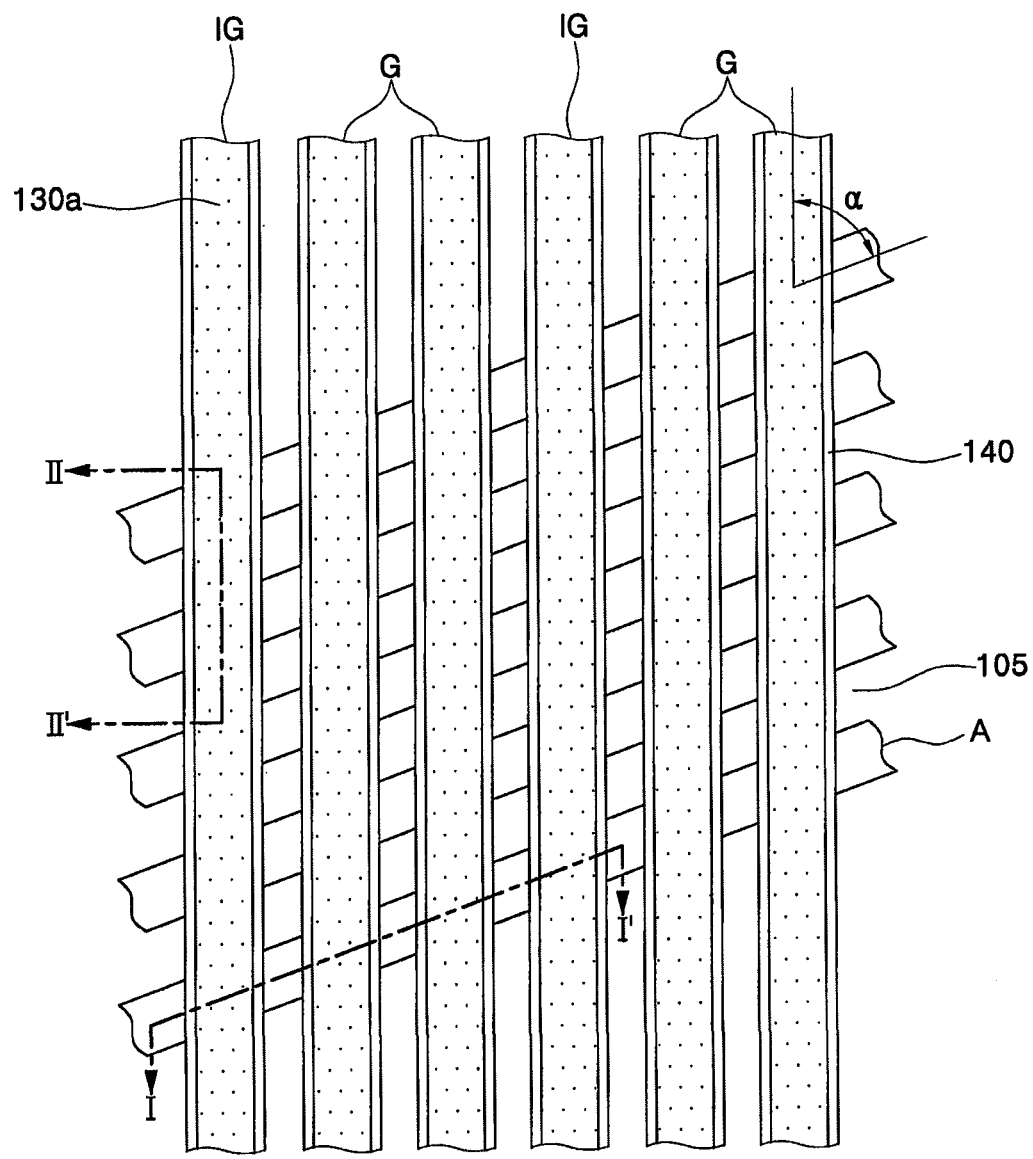
Figure 3B:
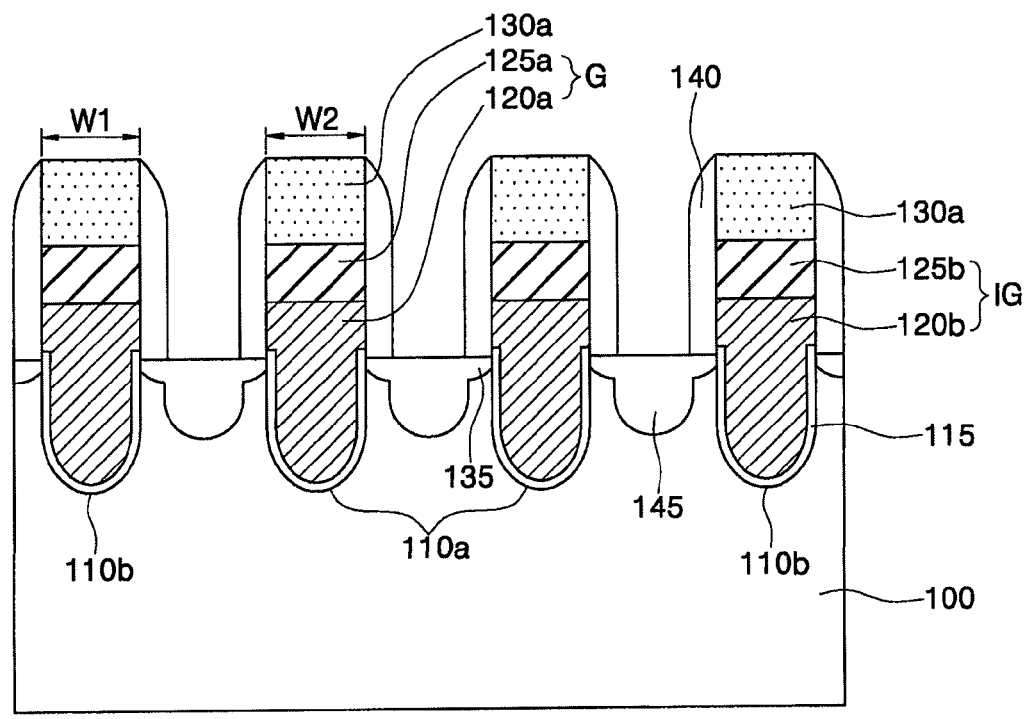
Figure 3C:
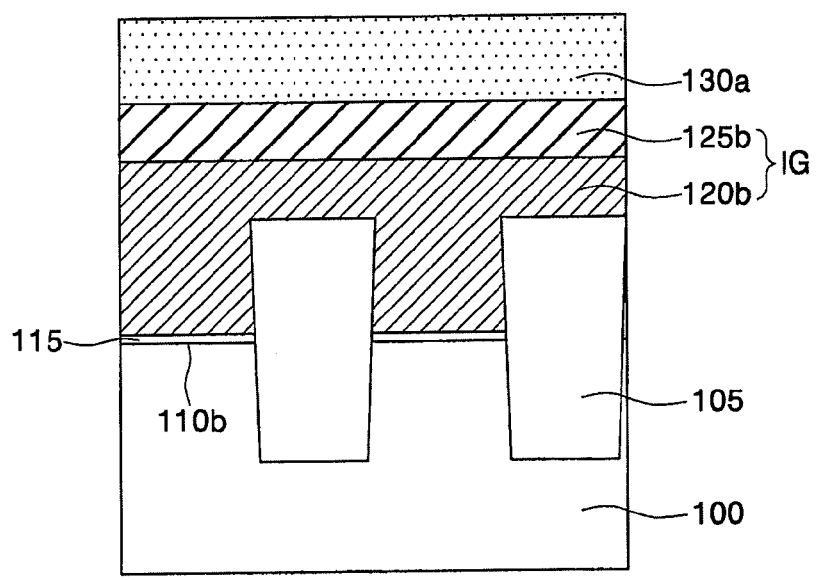

Referring to FIGS. 3A, 3B, and 3C, the hard mask layer 130 is patterned to form hard mask patterns 130a which intersect upper portions of the line type active regions A. By using the hard mask patterns 130a as an etching mask, the metal silicide layer 125 and the polysilicon layer 120 are sequentially etched to form gate electrodes which intersect the upper portions of the line type active regions A. As the gate electrodes, recessed device gate electrodes G are formed over the device gate channel trenches 110a, and recessed device isolation gate electrodes IG are formed over the device isolation gate channel trenches 110b. At the same time, the gate insulating layer 115 may be etched. The recessed device gate electrodes G and the recessed device isolation gate electrodes IG are formed to have widths which are equal to widths of the device gate channel trenches 110a and the device isolation gate channel trenches 110b, respectively. This means that a width of the recessed gate electrode has a proportional relation with a length of gate channel. Therefore, if the width of the recessed gate electrode increases, a width of the lower channel trench also increases by the same width, so that the length of the gate channel increases.

Each of the recessed device gate electrodes G may be formed of a polysilicon pattern 120a and a metal silicide pattern 125a which are sequentially stacked. Each of the recessed device isolation gate electrodes IG may be formed of a polysilicon pattern 120b and a metal silicide pattern 125b which are sequentially stacked. Preferably, the widths W1 of the recessed device isolation gate electrodes IG are formed to be equal to or larger than the widths W2 of the recessed device gate electrodes G. Preferably, the line type active regions A and the gate electrodes G and IG are formed to have an intersection angle a of 20° to 90°.

By using the hard mask patterns 130a as a mask, impurity ions are implanted into the line type active regions A to form LDD source/drain regions 135. Next, gate spacers 140 which surround sidewalls of the hard mask patterns 130a and the gate electrodes G and IG are formed. The gate spacers 140 may be formed of a silicon nitride layer or a silicon oxide layer. By using the gate spacers 140 and the hard mask patterns 130a as a mask, impurity ions are implanted into the line type active regions A to form high concentration source/drain regions 145. After that, bit lines and capacitors are formed by using typical methods (not shown).

Write and read modes of the device fabricated according to embodiments of the present invention will now be described.

If an off bias is applied to the recessed device isolation gate electrodes IG, and if high voltages are applied to the recessed device gate electrodes G and the bit lines, associated transistors are in ON state, channels for information charge are formed under the recessed device gate electrodes G, the information charge transmitted from the bit lines pass through the source region, the channel, and drain region into storage electrodes which are formed as lower electrodes of the capacitors, so that one bit of information is stored.

By applying the off bias to the recessed device isolation gate electrodes IG the information charge transmitted from the bit lines is prevented from flowing into source regions of adjacent transistors by preventing formation of the channels under the device isolation gate electrodes IG.

According to the present invention, channel length can be enlarged by using recessed channels under the recessed device isolation gate electrodes IG in comparison to a conventional technique, so that it is possible to improve the reliability of the device isolation function. In addition, the widths W1 of the recessed device isolation gate electrodes IG can be formed to be larger than the widths W2 of the recessed device gate electrodes G, so that it is possible to enhance the device isolation function. In addition, channel length under the recessed device gate electrodes G can be enlarged by using recessed device gate electrodes G, so that it is possible to prevent a short channel effect that could result from the high integration degree of the semiconductor device.

FIGS. 4A to 6A are plan views for illustrating a semiconductor device fabricating method according to another embodiment of the present invention.

FIGS. 4B to 6B are cross sectional views taken along section line III-III' of FIGS. 4A to 6A.

FIGS. 4C to 6C are cross sectional views taken along section line IV-IV' of FIGS. 4A to 6A.

Figure 4A:
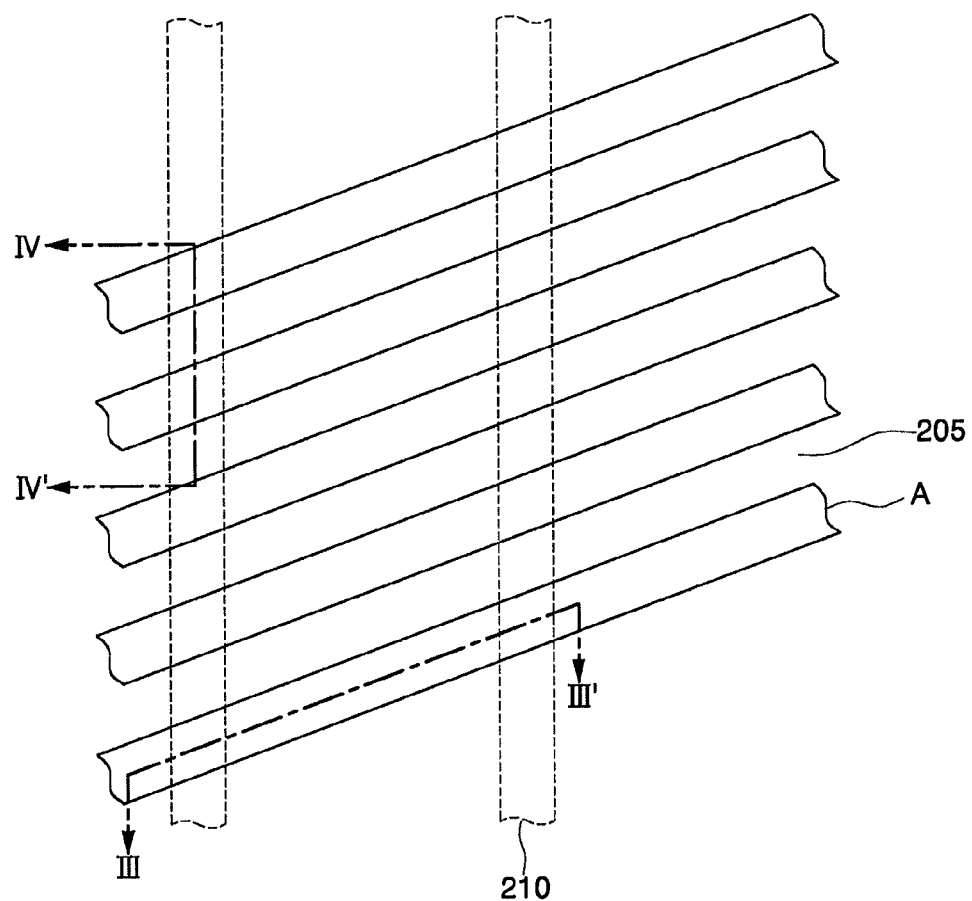
Figure 4B:
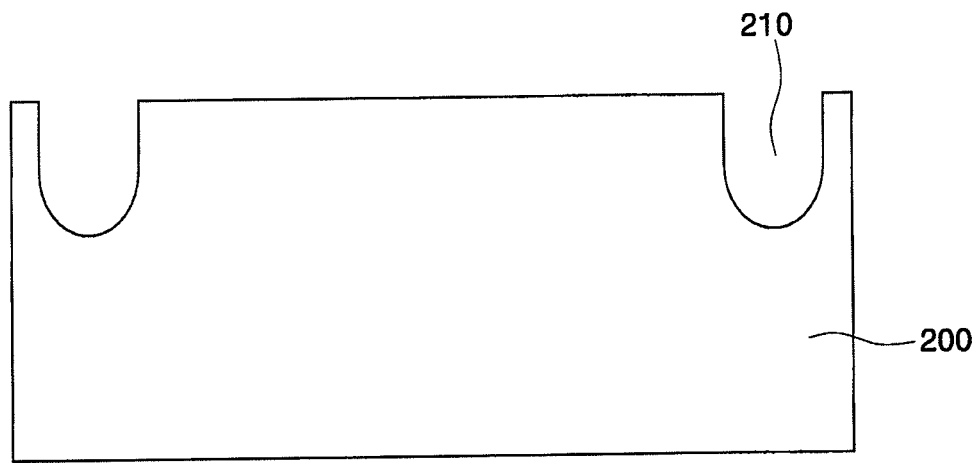
Figure 4C:
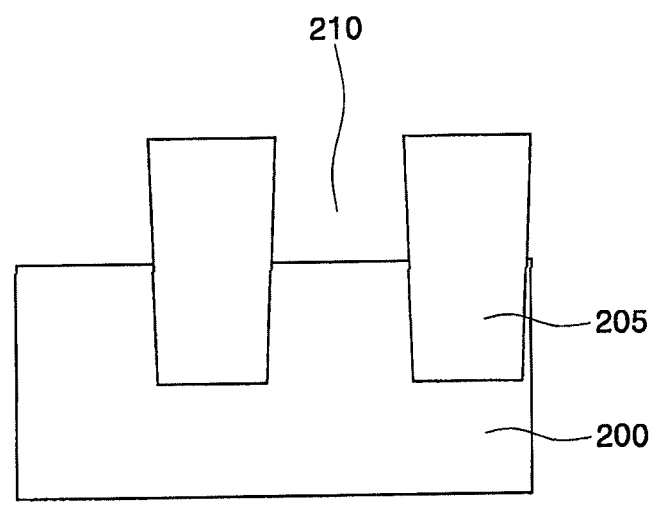

Referring to FIGS. 4A, 4B, and 4C, a device isolation layer 205 which defines active regions A is formed on an semiconductor substrate 200, and the active regions A are formed to have a line type structure. The device isolation layer 205 may be formed by using a shallow trench isolation) (STI) process. A portion of the line type active regions A in the semiconductor substrate is etched to a device isolation gate channel trenches 210. At the same time, a portion of a top surface of the device isolation layer 205 may be etched. The device isolation gate channel trenches 210 are formed to intersect the line type active regions A. Next, by using a wet rinsing process using a rinsing solution, that is, a mixture solution of NH$_4$OH, H$_2$O$_2$, and H$_2$O or a dry rinsing process using a chemical agent reacting with the semiconductor substrate 200, lower corners of the device isolation gate channel trenches 210 are optionally rounded.

Figure 5A:
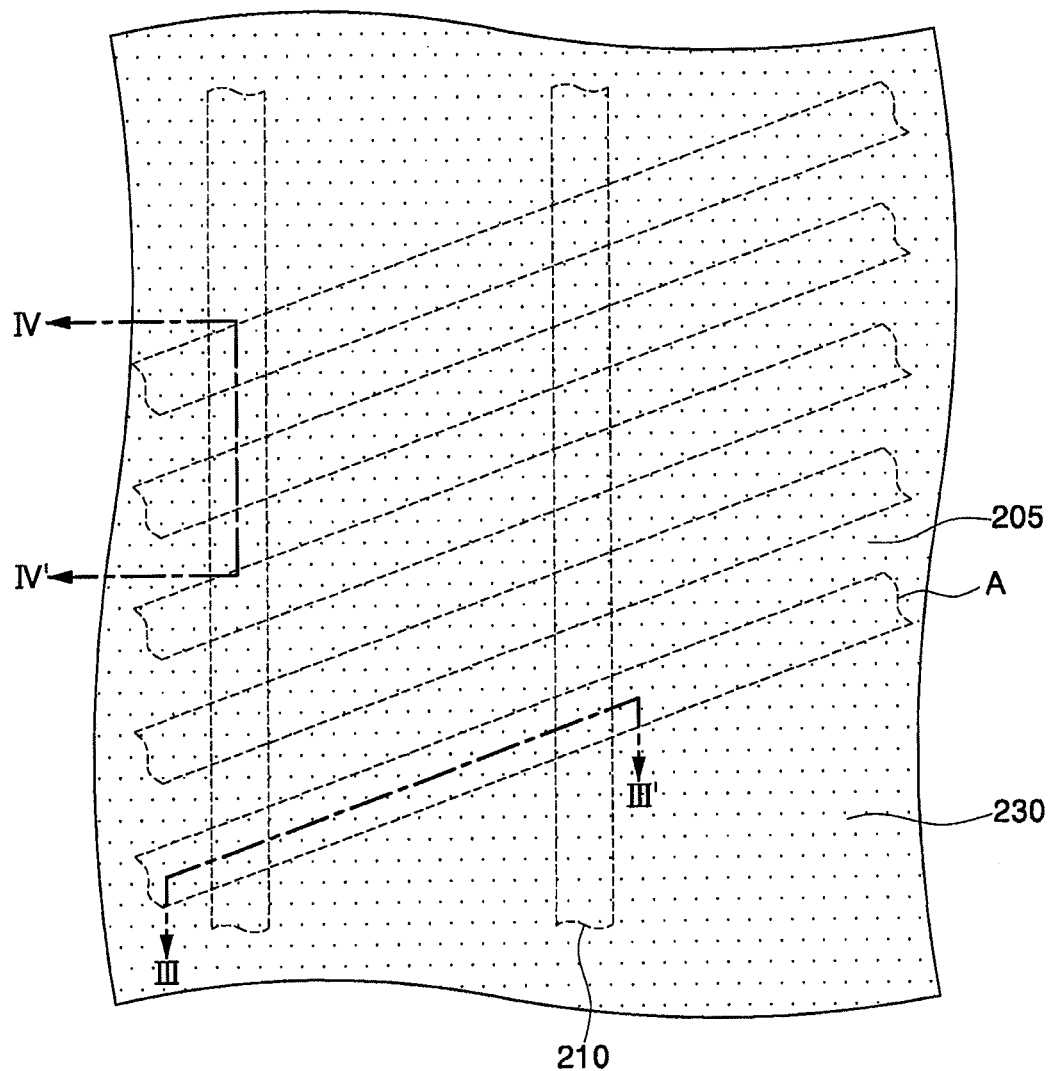
Figure 5B:
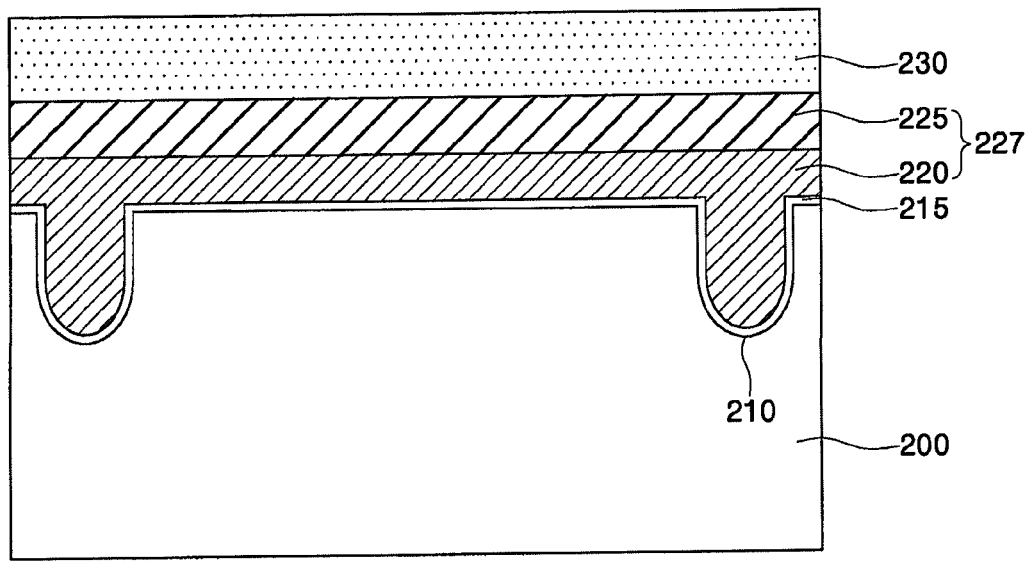
Figure 5C:
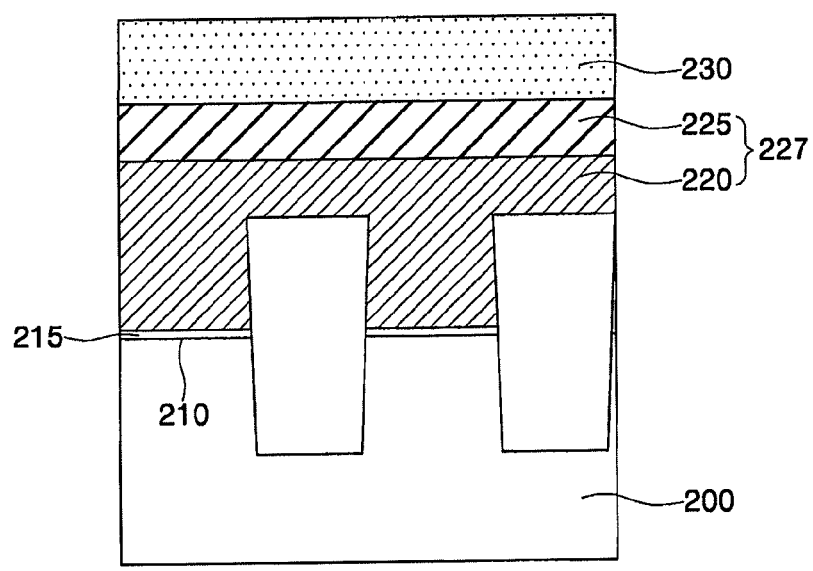

Referring to FIGS. 5A, 5B, and 5C, a conformal gate insulating layer 215 is formed on the semiconductor substrate on which the device isolation gate channel trenches 210 are formed. Preferably, the gate insulating layer 215 is formed by performing a thermal oxidation process on the semiconductor substrate. A gate electrode layer 227 filling the device isolation gate channel trenches 210 is formed on the semiconductor substrate having the gate insulating layer 215. The gate electrode layer 227 may be formed of a polysilicon layer 220 and a metal silicide layer 225 which are sequentially stacked. The metal silicide layer 225 may be formed of tungsten silicide (WSi). A hard mask layer 230 is formed on the gate electrode layer 227. The hard mask layer 230 may be formed of a silicon nitride layer.

Figure 6A:
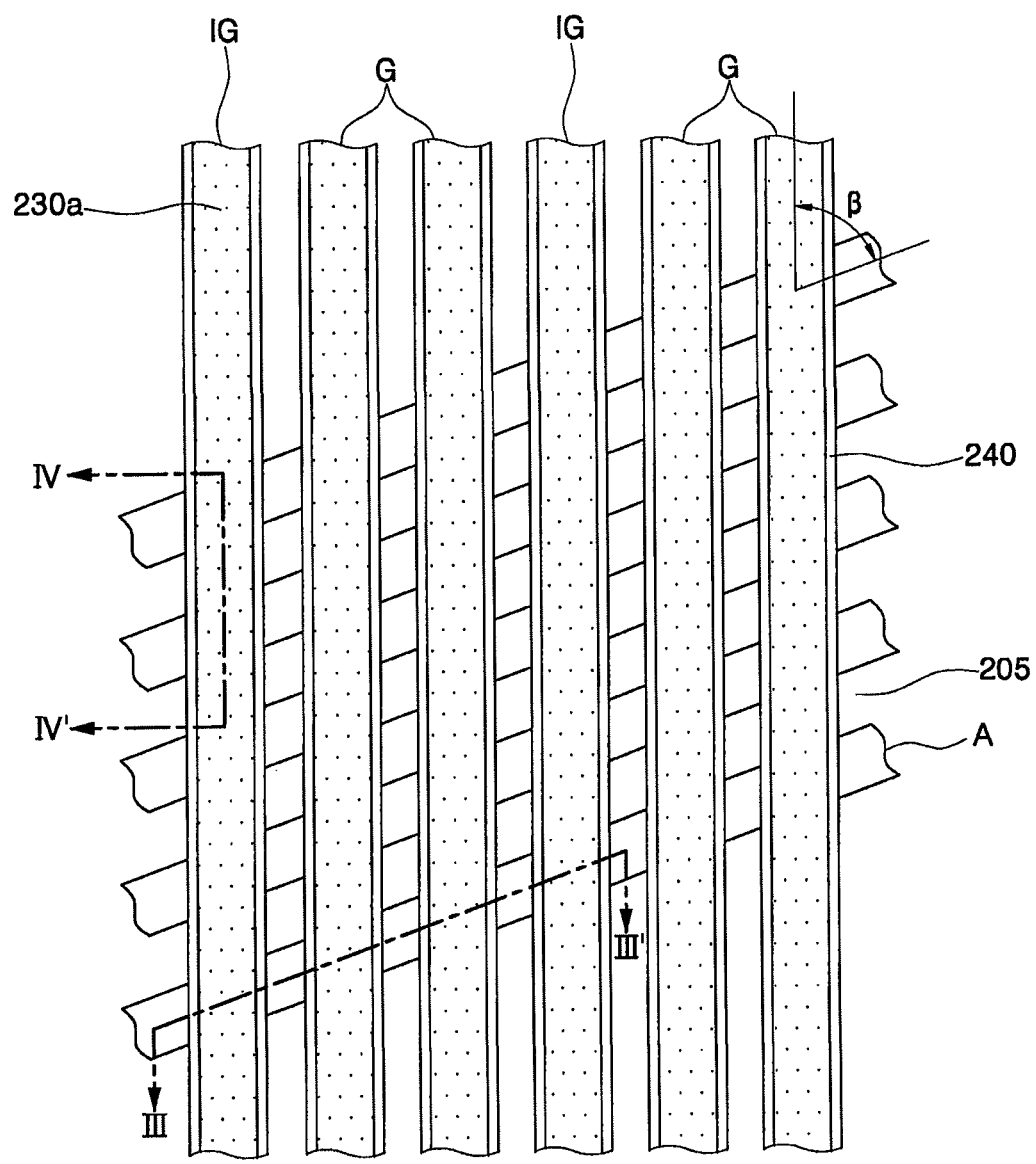
Figure 6B:
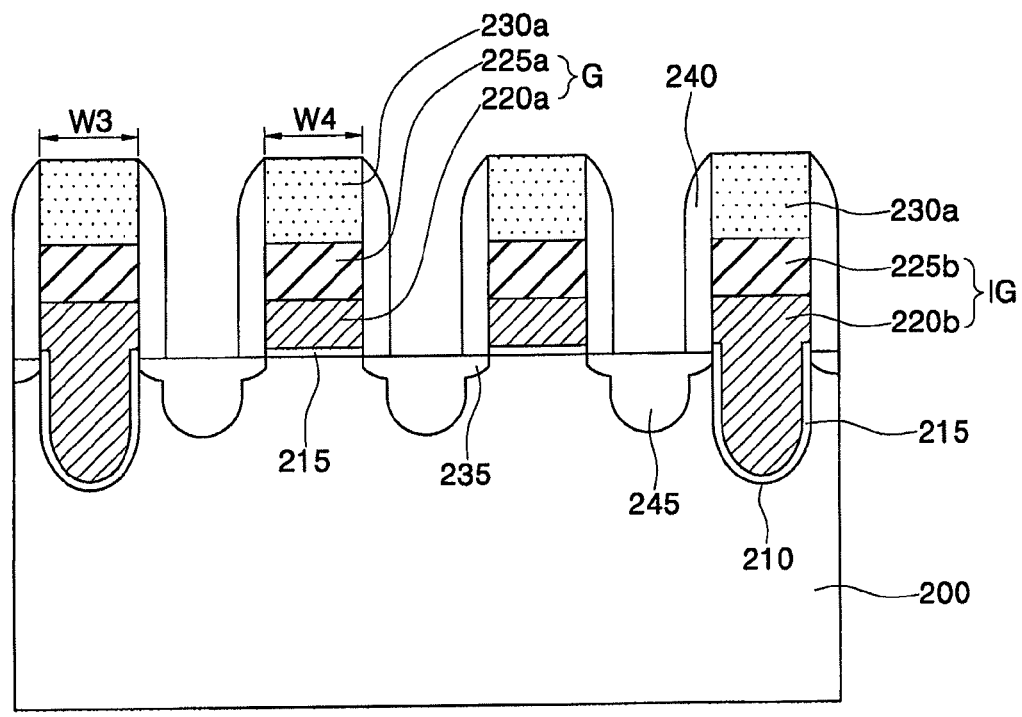
Figure 6C:
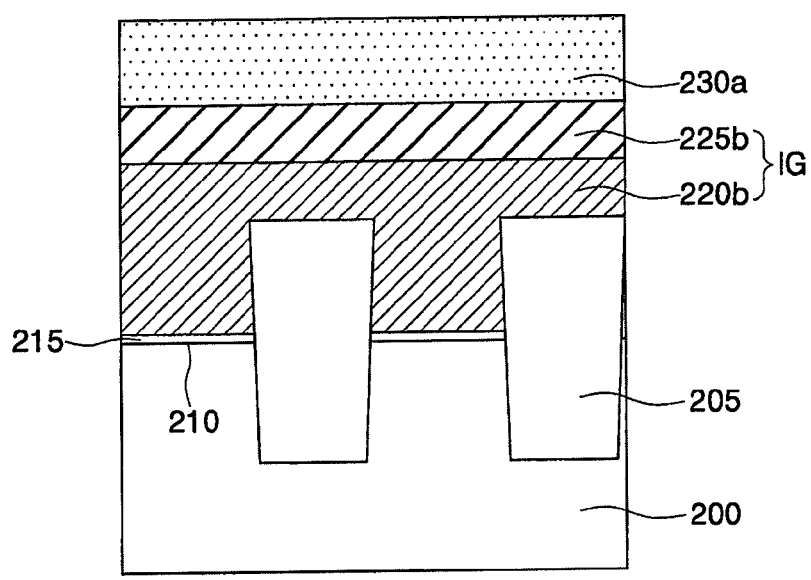

Referring to FIGS. 6A, 6B, and 6C, the hard mask layer 230 is patterned to form hard mask patterns 230a which intersect upper portions of the line type active regions A. By using the hard mask patterns 230a as an etching mask, the metal silicide layer 225 and the polysilicon layer 220 are sequentially etched to form gate electrodes which intersect the upper portions of the line type active regions A. As the gate electrodes, recessed device isolation gate electrodes IG are formed over the device isolation gate channel trenches 210, and planar type device gate electrodes G parallel to the recessed device isolation gate electrodes IG are formed. At the same time, the gate insulating layer 215 may be etched. The recessed device isolation gate electrodes IG are formed to have widths which are equal to widths of the device isolation gate channel trenches 210. This means that a width of the recessed gate electrode has a proportional relation with a length of gate channel. Therefore, if the width of the recessed gate electrode increases, a width of the lower channel trench also increases by the same width, so that the length of the gate channel increases.

Each of the planar type device gate electrodes G may be formed of a polysilicon pattern 220a and a metal silicide pattern 225a which are sequentially stacked. Each of the recessed device isolation gate electrodes IG may be formed of a polysilicon pattern 220b and a metal silicide pattern 225b which are sequentially stacked. Preferably, the widths W3 of the recessed device isolation gate electrodes IG are formed to be equal to or larger than the widths W4 of the planar type device gate electrodes G. Preferably, the line type active regions A and the gate electrodes G and IG are formed to have an intersection angle β of 20° to 90°.

By using the hard mask patterns 230a as a mask, impurity ions are implanted into the line type active regions A to form LDD source/drain regions 235. Next, gate spacers 240 which surround sidewalls of the hard mask patterns 230a and the gate electrodes G and IG are formed. The gate spacers 240 may be formed of a silicon nitride layer or a silicon oxide layer. By using the gate spacers 240 and the hard mask patterns 230a as a mask, impurity ions are implanted into the line type active regions A to form a high concentration source/drain regions 245. After that, bit lines and capacitors are formed by using typical methods (not shown).

Write and read modes of the device fabricated according to embodiments of the present invention will now be described. If an off bias is applied to the recessed device isolation gate electrodes IG, and if high voltages are applied to the planar type device gate electrodes G and the bit lines, associated transistors are in ON state, channels for information charge are formed under the planar type device gate electrodes G, the information charge transmitted from the bit lines passes through the source region, the channel, and drain region into storage electrodes which are formed as lower electrodes of the capacitors, so that a bit of information is stored.

By applying the off bias to the recessed device isolation gate electrodes IG, the information charge transmitted from the bit lines is prevented from flowing into source regions of adjacent transistors by preventing formation of current channels under the device isolation gate electrodes IG.

According to the present invention, channel length can be enlarged by using recessed channels under the recessed device isolation gate electrodes IG in comparison to a conventional technique, so that it is possible to improve the reliability of the device isolation function. In addition, the widths W3 of the recessed device isolation gate electrodes IG can be formed to be larger than the widths W4 of the planar type device gate electrodes G, so that it is possible to enhance the device isolation function.

FIGS. 7A to 9A are plan views for illustrating a semiconductor device fabricating method according to still another embodiment of the present invention.

FIGS. 7B to 9B are cross sectional views taken along section line V-V' of FIGS. 7A to 9A.

FIGS. 7C to 9C are cross sectional views taken along section line VI-VI' of FIGS. 7A to 9A.

Figure 7A:
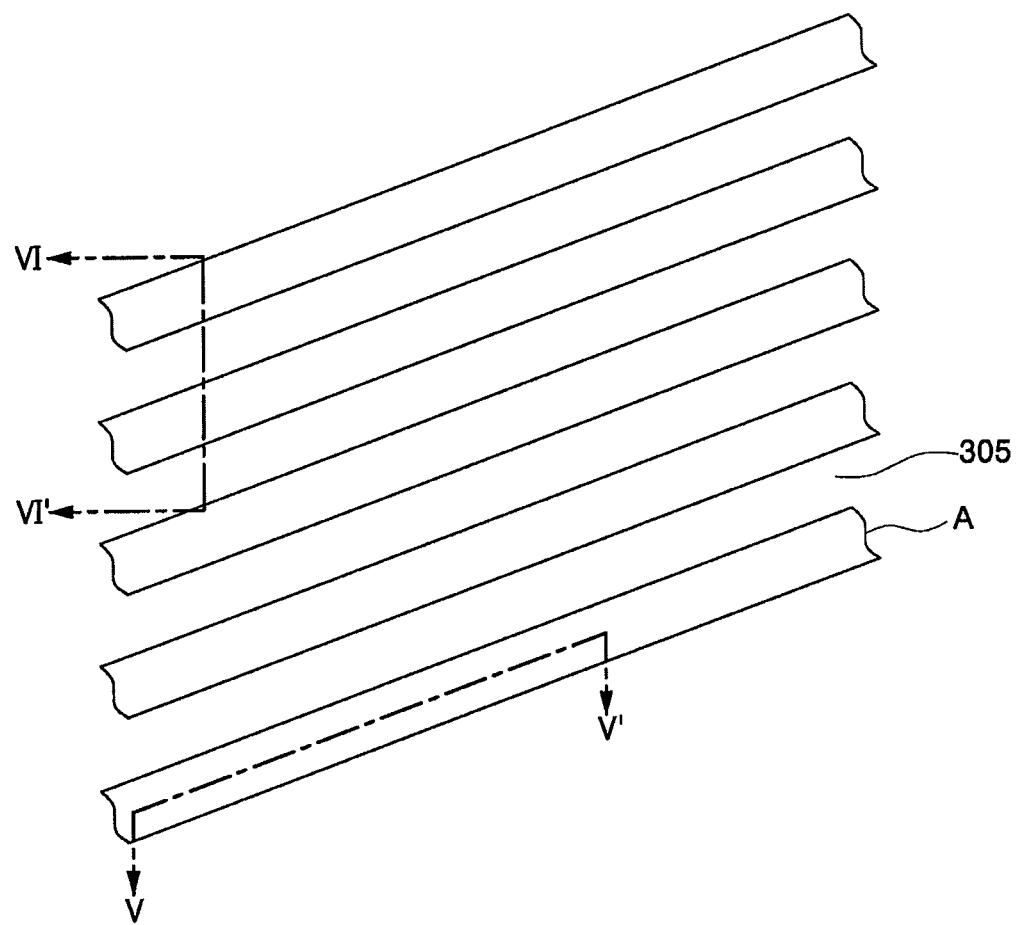
Figure 7B:
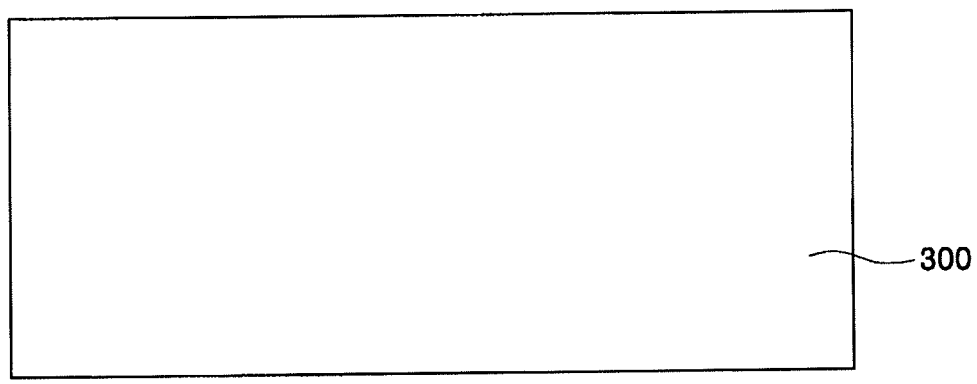
Figure 7C:
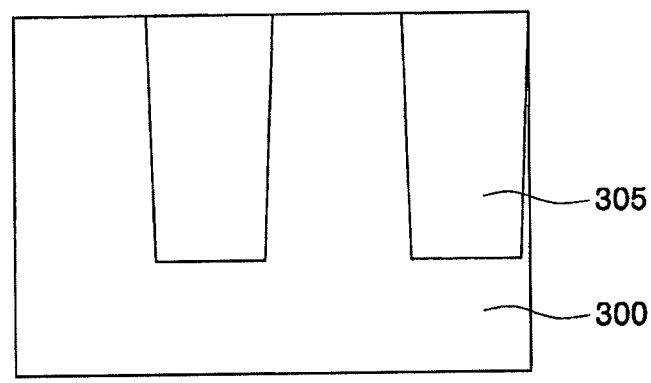

Referring to FIGS. 7A, 7B, and 7C, a device isolation layer 305 which defines active regions A is formed on a semiconductor substrate 300. Here, the active regions A are formed to have a line type structure. The device isolation layer 305 may be formed by using a shallow trench isolation (STI) process.

Figure 8A:
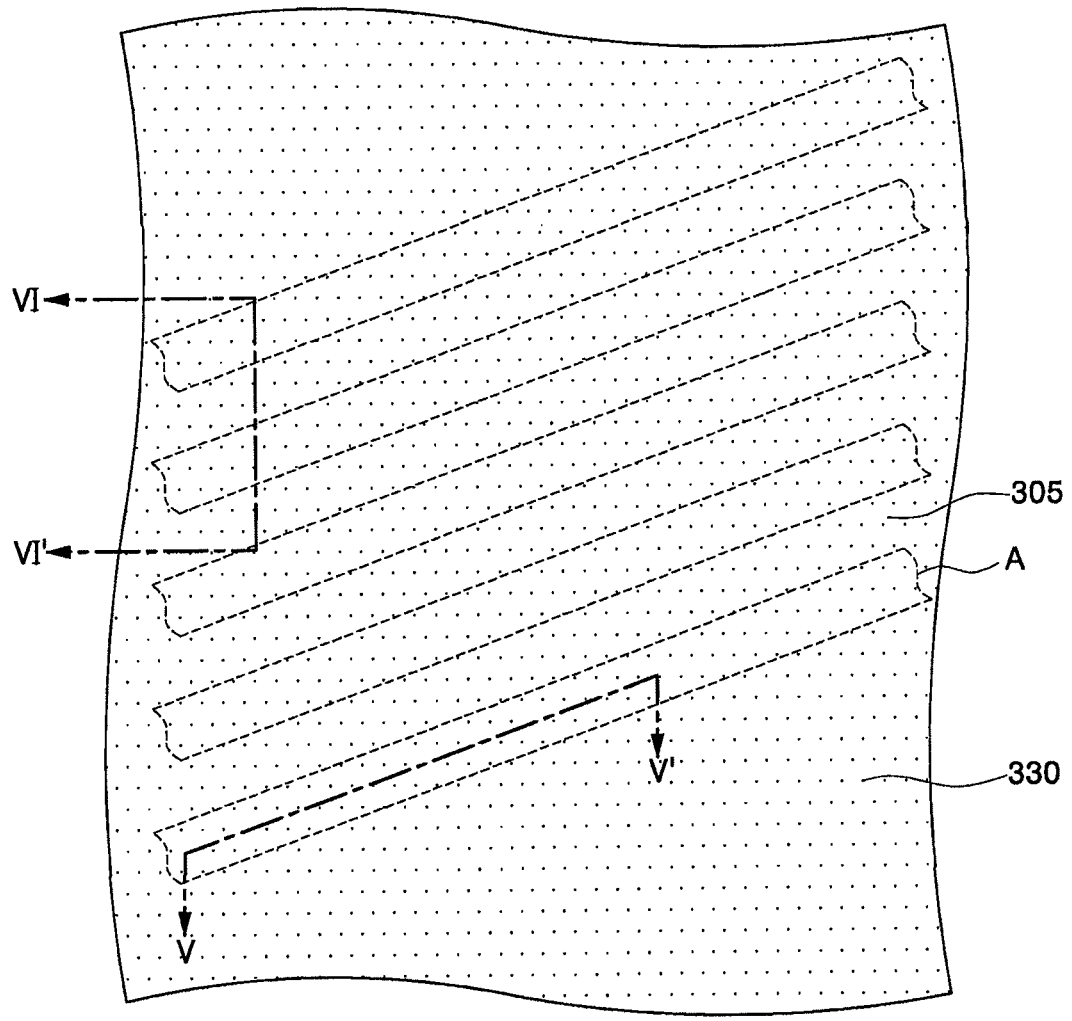
Figure 8B:
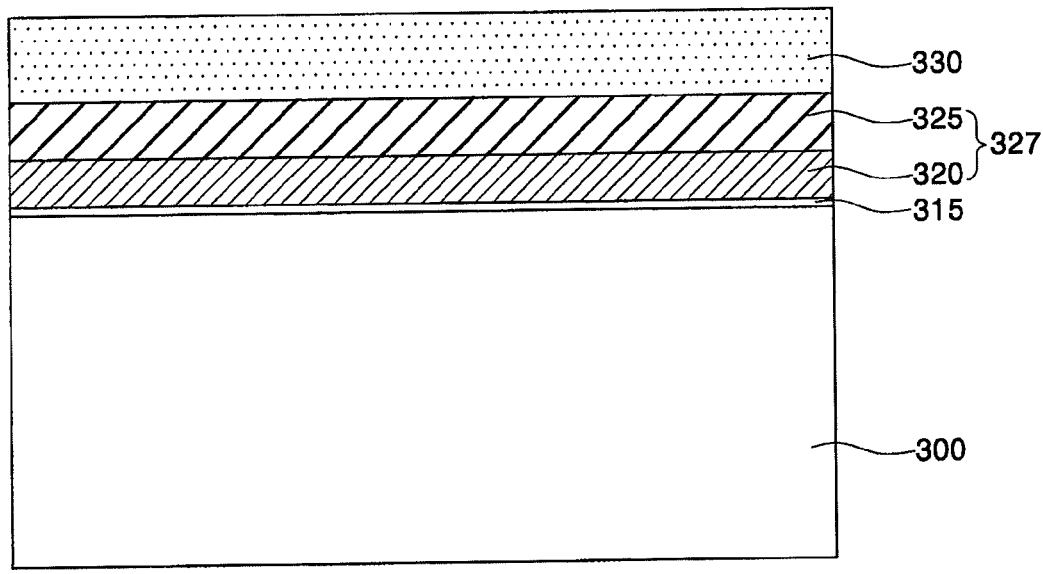
Figure 8C:
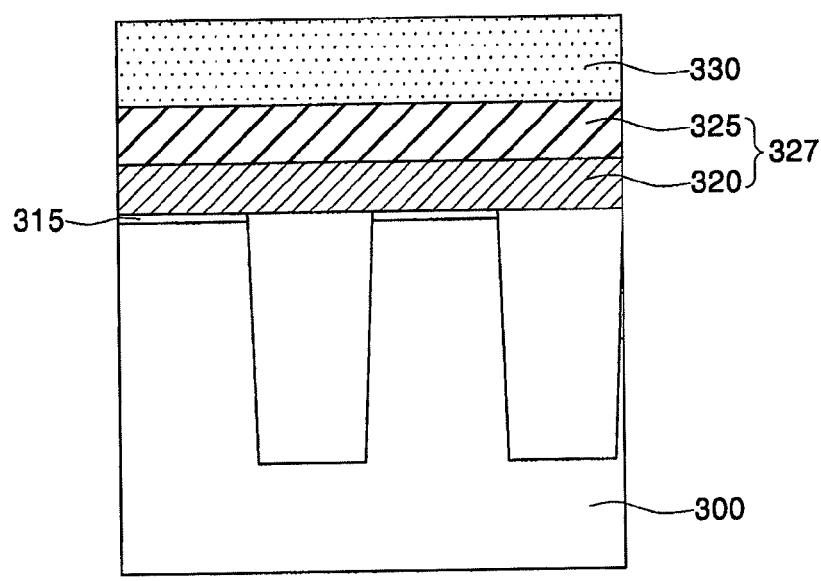

Referring to FIGS. 8A, 8B, and 8C, a gate insulating layer 315 is formed on the line type active regions A. Preferably, the gate insulating layer 315 is formed by performing a thermal oxidation process on the semiconductor substrate. A gate electrode layer 327 is formed on the semiconductor substrate having the gate insulating layer 315. The gate electrode layer 327 may be formed of a polysilicon layer 320 and a metal silicide layer 325 which are sequentially stacked. The metal silicide layer 325 may be formed of tungsten silicide (WSi). A hard mask layer 330 is formed on the gate electrode layer 327. The hard mask layer 330 may be formed of a silicon nitride layer.

Figure 9A:
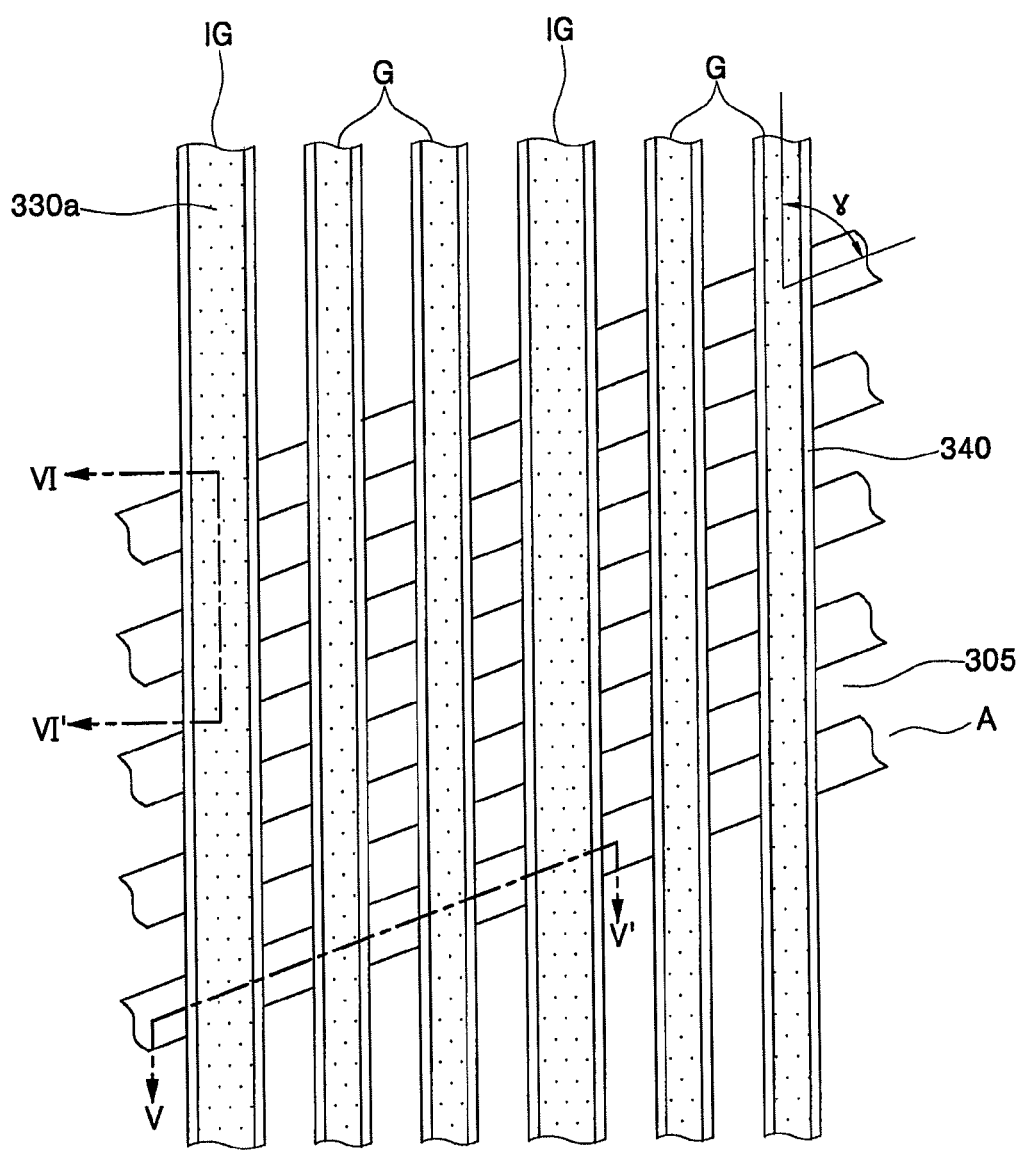
Figure 9B:
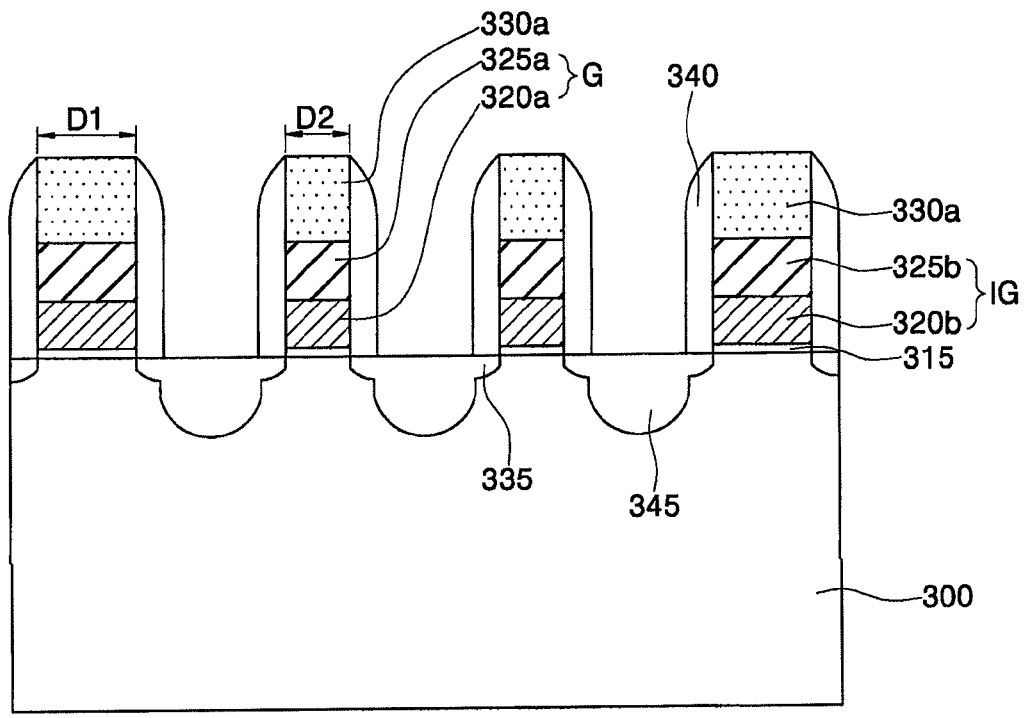
Figure 9C:
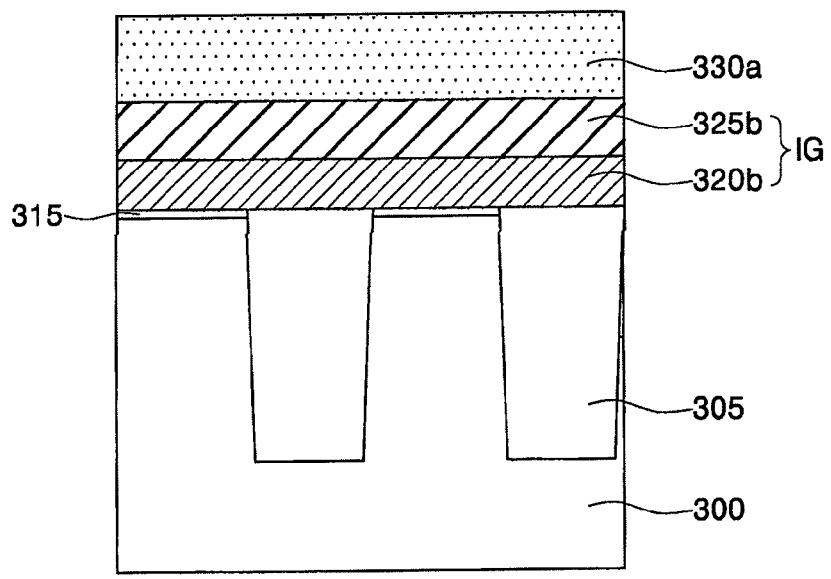

Referring to FIGS. 9A, 9B, and 9C, the hard mask layer 330 is patterned to form hard mask patterns 330a which intersect upper portions of the line type active regions A. By using the hard mask patterns 330a as an etching mask, the metal silicide layer 325 and the polysilicon layer 320 are sequentially etched to form gate electrodes which are parallel to each other and intersect the upper portions of the line type active regions A. The gate electrodes are formed of planar type device gate electrodes G and planar type device isolation gate electrodes IG, and widths D1 of the planar type device isolation gate electrodes are formed to be larger than widths D2 of the planar type device gate electrodes G. At the same time, the gate insulating layer 315 may be etched.

Each of the planar type device gate electrodes G may be formed of a polysilicon pattern 320a and a metal silicide pattern 325a which are sequentially stacked. Each of the planar type device isolation gate electrodes IG may be formed of a polysilicon pattern 320b and a metal silicide pattern 325b which are sequentially stacked. Preferably, the line type active regions A and the gate electrodes G and IG are formed to have an intersection angle γ of 20° to 90°.

By using the hard mask patterns 330a as a mask, impurity ions are implanted into the line type active regions A to form LDD source/drain regions 335. Next, gate spacers 340 which surround sidewall of the hard mask patterns 330a and the gate electrodes G and IG are formed. The gate spacers 340 may be formed of a silicon nitride layer or a silicon oxide layer. By using the gate spacers 340 and the hard mask patterns 330a as a mask, impurity ions are implanted into the line type active regions A to form a high concentration source/drain regions 345. After that, bit lines and capacitors are formed by using typical methods (not shown).

Write and read modes of the device fabricated according to embodiments of the present invention will now be described. If an off bias is applied to the planar type device isolation gate electrodes IG, and if high voltages are applied to the planar type device gate electrodes G and the bit lines, associated transistors are in an ON state, channels for information charge are formed under the planar type device gate electrodes G, the information charge transmitted from the bit lines pass through the source region, the channel, and drain region into storage electrodes which are formed as lower electrodes of the capacitors, so that a bit of information is stored.

By applying the off bias to the planar type device isolation gate electrodes IG, the information charge transmitted from the bit lines is prevented from flowing into source regions of adjacent transistors by preventing formation of the channels under the device isolation gate electrodes IG.

According to the present invention, since the widths D1 of the planar type device isolation gate electrodes IG are formed to be larger than the widths D2 of the planar type device gate electrodes G, channel length can be enlarged in comparison to a conventional technique, so that so that it is possible to improve the reliability of the device isolation function.

FIGS. 10A to 12A are plan views for illustrating a semiconductor device fabricating method according to further still another embodiment of the present invention.

FIGS. 10B to 12B are cross sectional views taken along section line VII-VII' of FIGS. 10A to 12A.

FIGS. 10C to 12C are cross sectional views taken along section line VIII-VIII' of FIGS. 10A to 12A.

Figure 10A:
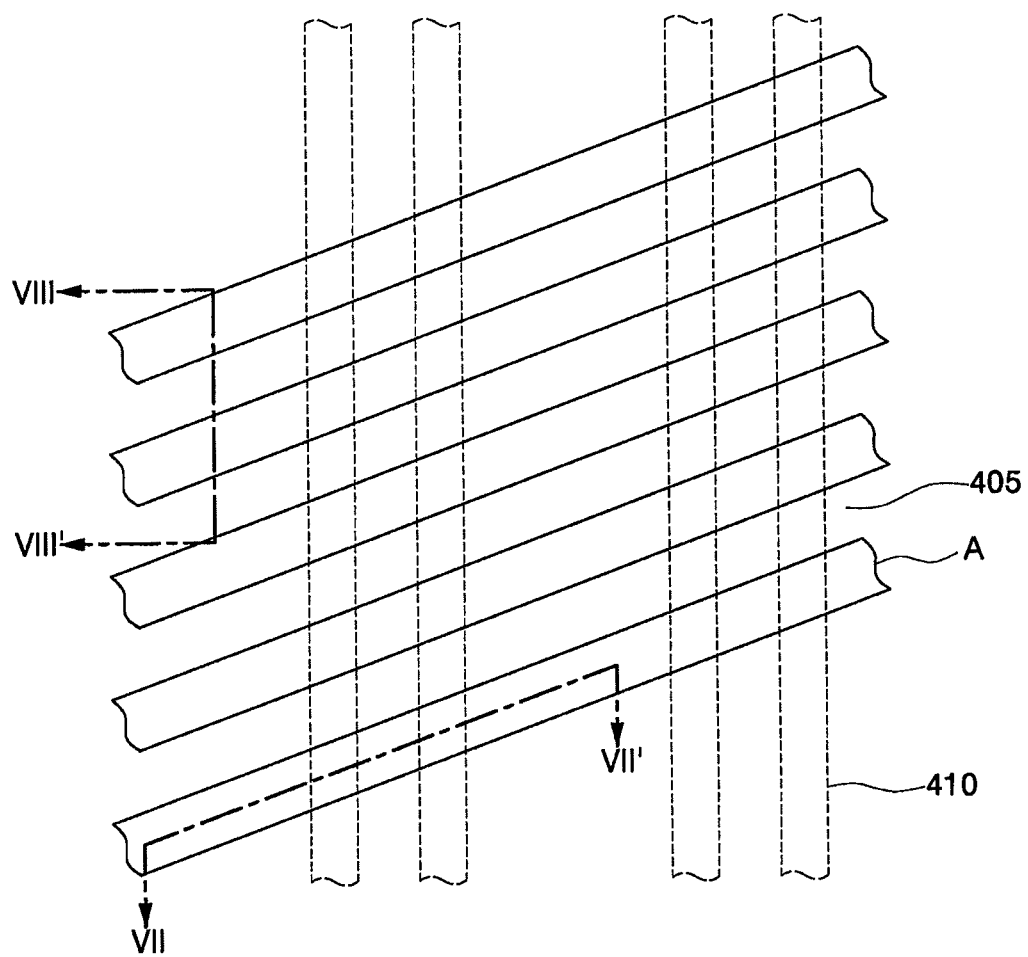
Figure 10B:
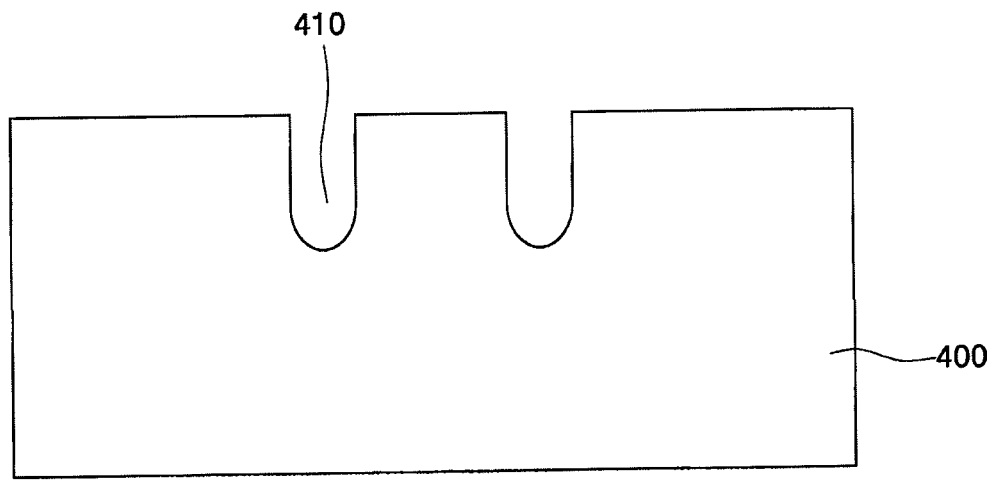
Figure 10C:
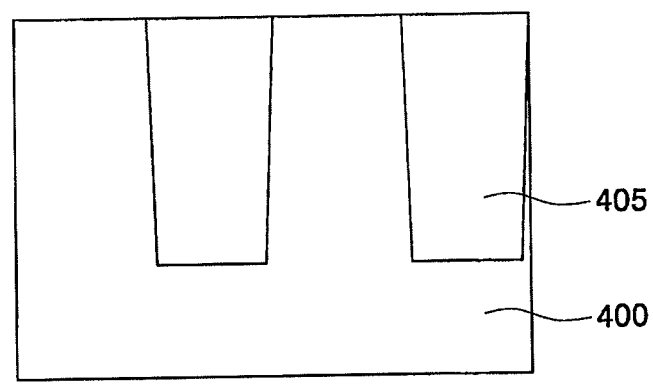
Figure 11A:
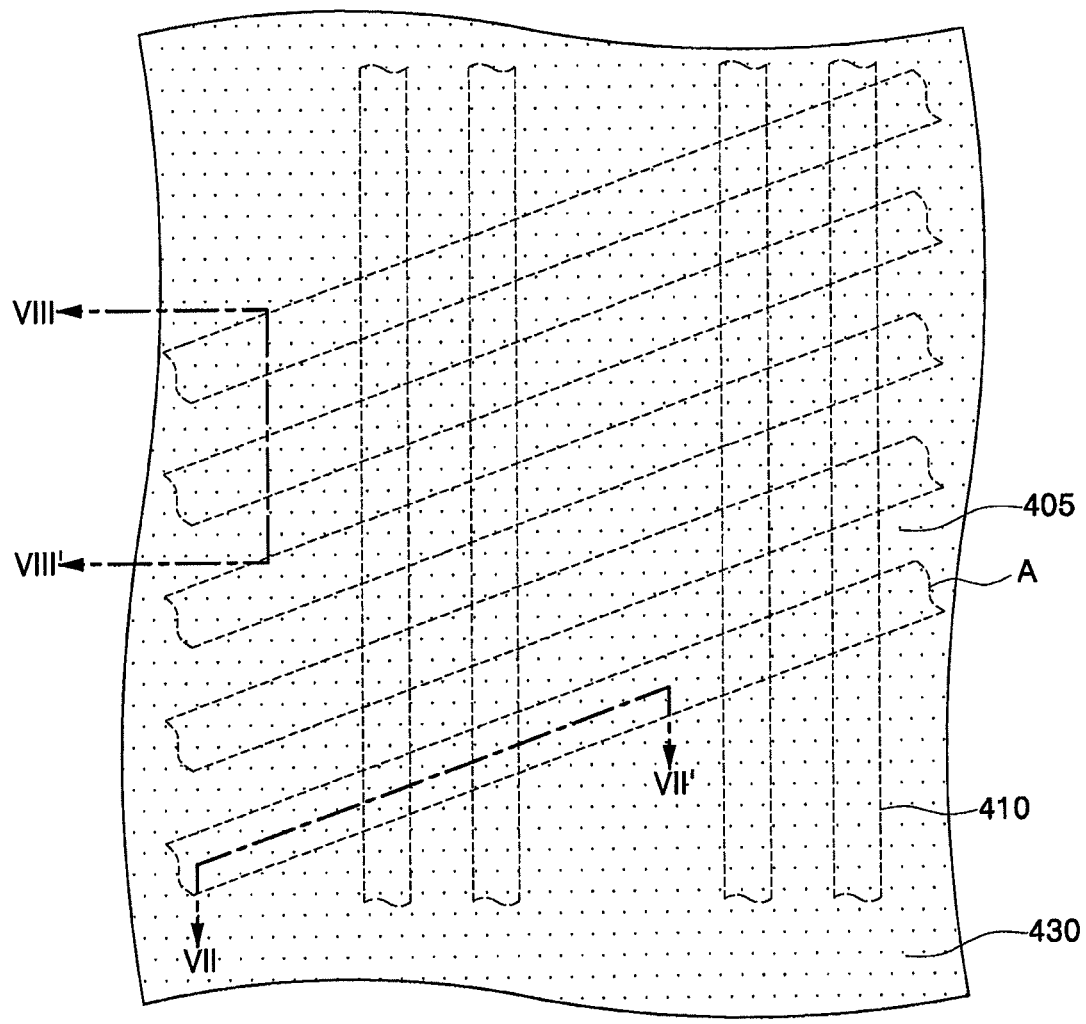
Figure 11B:
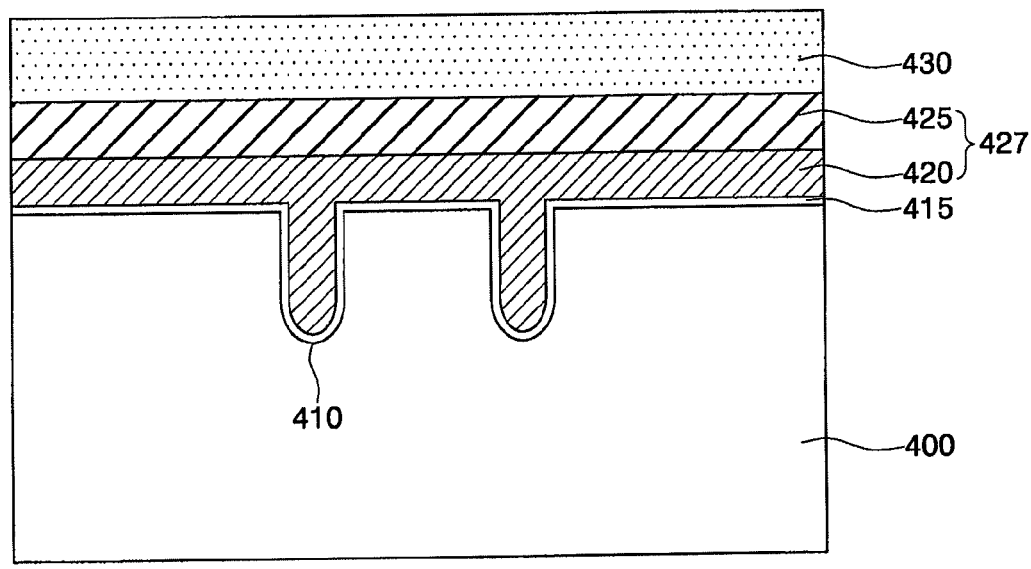
Figure 11C:
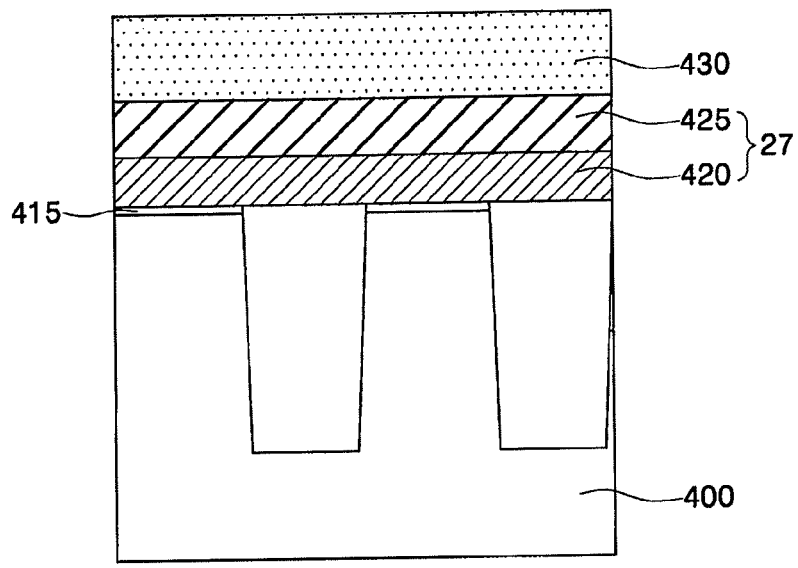

Referring to FIGS. 10A, 10B, and 10C, a device isolation layer 405 which defines active regions A is formed on a semiconductor substrate 400. Here, the active regions A are formed to have a line type structure. The device isolation layer 405 may be formed by using a shallow trench isolation (STI) process. A portion of the line type active regions A in the semiconductor substrate is etched to a device gate channel trenches 410. At the same time, a portion of a top surface of the device isolation layer 405 may be etched. The device gate channel trenches 410 are formed to intersect the line type active regions A. Next, by using a wet rinsing process using a rinsing solution, that is, a mixture solution of $NH_4OH$, $H_2O_2$, and $H_2O$ or a dry rinsing process using a chemical agent reacting with the semiconductor substrate 400, lower corners of the device gate channel trenches 410 are optionally rounded. Referring to FIGS. 11A, 11B, and 11C, a conformal gate insulating layer 415 is formed on the semiconductor substrate on which the device gate channel trenches 410 are formed. Preferably, the gate insulating layer 415 is formed by performing a thermal oxidation process on the semiconductor substrate. A gate electrode layer 427 filling the device gate channel trenches 410 is formed on the semiconductor substrate having the gate insulating layer 415. The gate electrode layer 427 may be formed of a polysilicon layer 420 and a metal silicide layer 425 which are sequentially stacked. The metal silicide layer 425 may be formed of tungsten silicide (WSi). A hard mask layer 430 is formed on the gate electrode layer 427. The hard mask layer 430 may be formed of a silicon nitride layer.

Figure 12A:
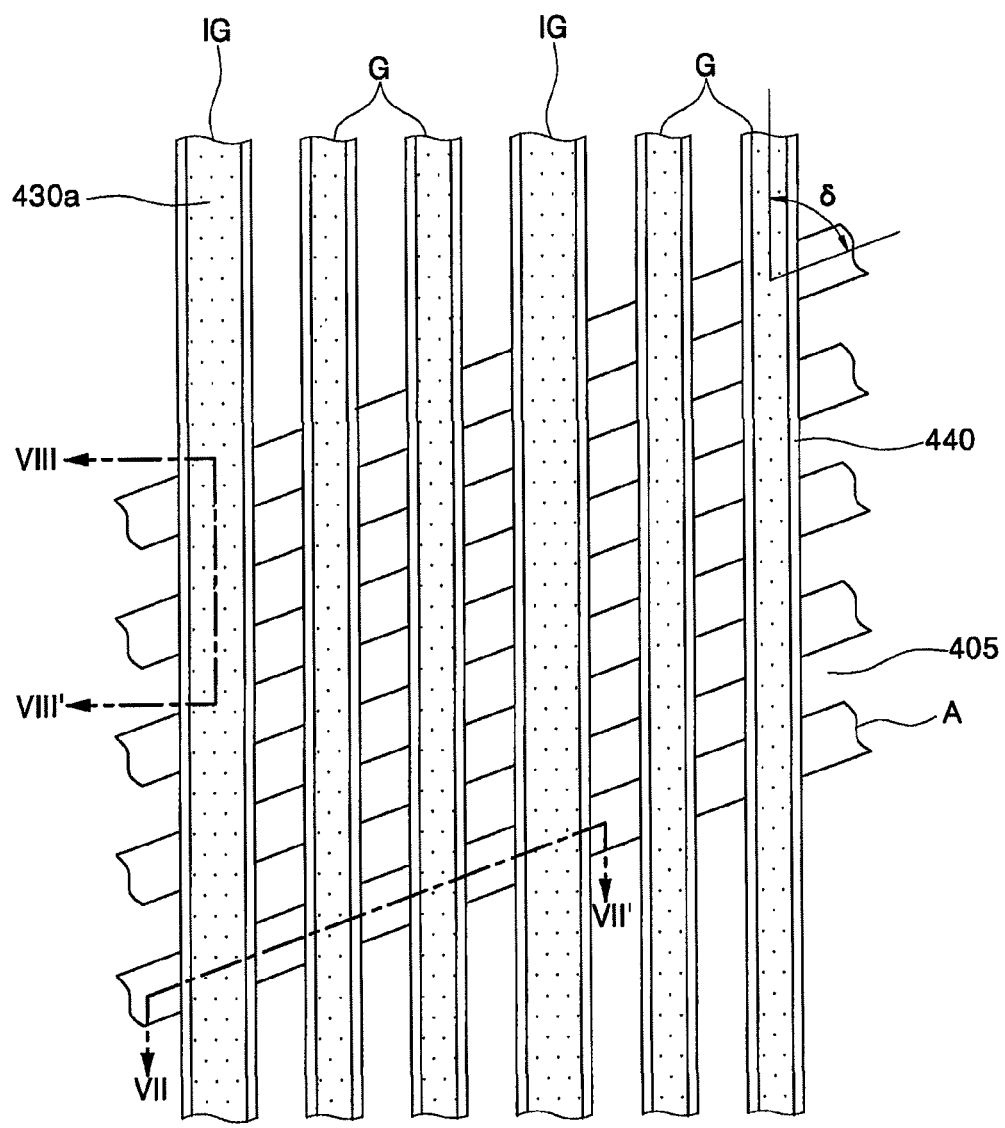
Figure 12B:
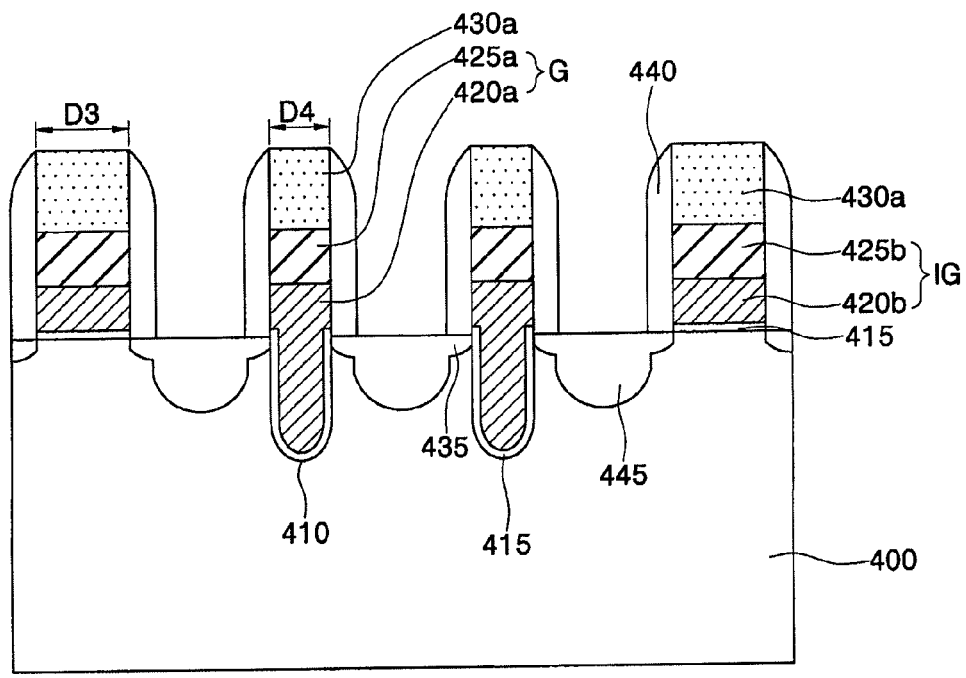
Figure 12C:
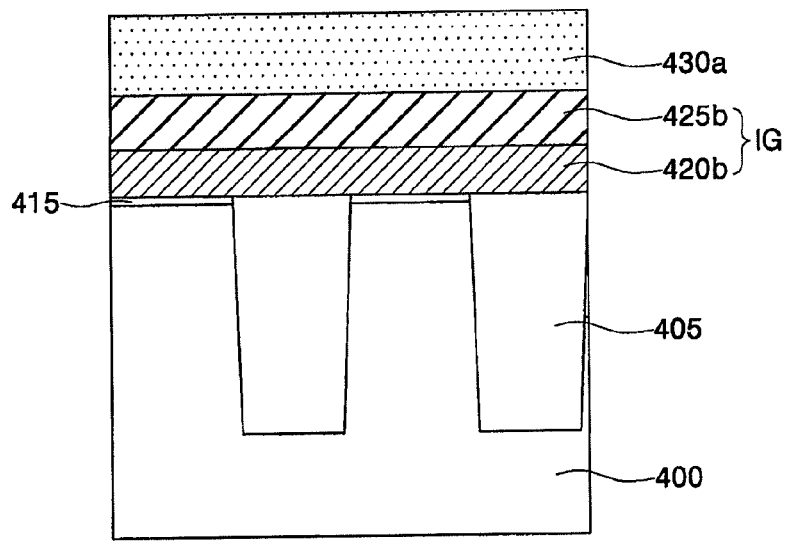

Referring to FIGS. 12A, 12B, and 12C, the hard mask layer 430 is patterned to form hard mask patterns 430a which intersect upper portions of the line type active regions A. By using the hard mask patterns 430a as an etching mask, the metal silicide layer 425 and the polysilicon layer 420 are sequentially etched to form gate electrodes which intersect the upper portions of the line type active regions A. As the gate electrodes, recessed device gate electrodes G are formed over the device gate channel trenches 410, and planar type device isolation gate electrodes IG parallel to the recessed device gate electrodes G are formed. Widths D3 of the planar type device isolation gate electrodes IG are formed to be larger than widths D4 of the recessed device gate electrodes G. At the same time, the gate insulating layer 415 may be etched. The recessed device gate electrodes G are formed to have widths which are equal to widths of the device gate channel trenches 410.

Each of the recessed device gate electrodes G may be formed of a polysilicon pattern 420a and a metal silicide pattern 425a which are sequentially stacked. Each of the planar type device isolation gate electrodes IG may be formed of a polysilicon pattern 420b and a metal silicide pattern 425b which are sequentially stacked. Preferably, the line type active regions A and the gate electrodes G and IG are formed to have an intersection angle δ of 20° to 90°.

By using the hard mask patterns 430a as a mask, impurity ions are implanted into the line type active regions A to form LDD source/drain regions 435. Next, gate spacers 440 which surround sidewall of the hard mask patterns 430a and the gate electrodes G and IG are formed. The gate spacers 440 may be formed of a silicon nitride layer or a silicon oxide layer. By using the gate spacers 440 and the hard mask patterns 430a as a mask, impurity ions are implanted into the line type active regions A to form a high concentration source/drain regions 445. After that, bit lines and capacitors are formed by using typical methods (not shown).

Write and read modes of the device fabricated according to embodiments of the present invention will now be described. If an off bias is applied to the planar type device isolation gate electrodes IG, and if high voltages are applied to the recessed device gate electrodes G and the bit lines, associated transistors are in ON state, channels for information charge are formed under the recessed device gate electrodes G, the information charge transmitted from the bit liens pass through the source region, the channel, and drain region into storage electrodes which are formed as lower electrodes of the capacitors, so that a bit of information is stored.

By applying the off bias to the planar type device isolation gate electrodes IG, the information charge transmitted from the bit lines is prevented from flowing into source regions of adjacent transistors by preventing formation of the channels under the device isolation gate electrodes IG.

According to the present invention, the widths D3 of the planar type device isolation gate electrodes IG are formed to be larger than the D4 of the recessed device gate electrodes G, channel length can be enlarged in comparison to a conventional technique, so that it is possible to improve reliability of the device isolation function. In addition, channel length under the recessed device gate electrodes G can be enlarged by using recessed device gate electrodes G, so that it is possible to prevent a short channel effect from occurring although the semiconductor device is highly integrated.

Now, returning to FIGS. 3A, 3B and 3C, a semiconductor device according to an embodiment of the present invention will be again described.

Referring to FIGS. 3A, 3B, and 3C, the semiconductor device includes a device isolation layer 105 which defines active regions. A in a semiconductor substrate 100. Preferably, the device isolation layer 105 has a shallow trench isolation(STI) structure. Gate electrodes which are parallel to each other and intersect the line type active regions A are disposed on the semiconductor substrate 100. Here, the gate electrodes are constituted of device gate electrodes G and recessed device isolation gate electrodes IG. The device gate electrode G may be a planar type device gate electrode or a recessed device gate electrode. In the present embodiment, the recessed device gate electrodes are exemplified. The recessed device gate electrodes G may be constituted of a polysilicon pattern 120a and a tungsten silicide pattern 125a which are sequentially stacked. In addition, the recessed device isolation gate electrodes IG may be a polysilicon pattern 120b and a tungsten silicide pattern 125b which are sequentially stacked.

Widths W1 of the recessed device isolation gate electrodes IG may be equal to or greater than widths W2 of the device gate electrodes G. Preferably, an off bias is applied to the recessed device isolation gate electrodes IG. An intersection angle a of the line type active regions A and the gate electrodes G and IG may be in a range of 20° to 90°.

Device isolation gate channel trenches 110b are disposed under the recessed device isolation gate electrodes IG in the semiconductor substrate. In addition, in a case where the device gate electrodes G are recessed device gate electrodes, device gate channel trenches 110a may be disposed under the recessed device gate electrodes G in the semiconductor substrate. A conformal gate insulating layer 115 may be disposed between the line type active regions A and the gate electrodes G and IG. Hard mask patterns 130a may be disposed over the gate electrodes G and IG. LDD source/drain regions 135 may be disposed between the gate electrodes G and IG in the line type active regions A. Gate spacers 140 which surround sidewalls of the hard mask patterns 130a and the gate electrodes G and IG may be included. The gate spacers 140 may be a silicon nitride layer or a silicon oxide layer. High concentration source/drain regions 145 may be disposed between the adjacent gate spacers 140 in the line type active regions A.

Now, returning to FIGS. 9A, 9B and 9C, a semiconductor device according to another embodiment of the present invention will be again described.

Referring to FIGS. 9A, 9B, and 9C, the semiconductor device includes a device isolation layer 305 which defines active regions A in a semiconductor substrate 300. Preferably, the device isolation layer 305 has a shallow trench isolation (STI) structure. Gate electrodes which are parallel to each other and intersect the line type active regions A are disposed on the semiconductor substrate 300. Here, the gate electrodes are constituted of device gate electrodes G and planar type device isolation gate electrodes IG. Here, widths D1 of the planar type device isolation gate electrodes IG are formed to be larger than widths D2 of the device gate electrodes G. The device gate electrodes G may be a planar type device gate electrode or a recessed device gate electrode. In the embodiment, the planar type device gate electrodes are exemplified. The planar type device gate electrodes G may be a polysilicon pattern 320a and a tungsten silicide pattern 325a which are sequentially stacked. In addition, the planar type device isolation gate electrodes IG may be a polysilicon pattern 320b and a tungsten silicide pattern 325b which are sequentially stacked.

Preferably, an off bias is applied to the planar type device isolation gate electrodes IG. An intersection angle γ of the line type active regions A and the gate electrodes G and IG may be in a range of 20° to 90°. In a case where the device gate electrodes G are recessed device gate electrodes, device gate channel trenches may be disposed under the recessed device gate electrodes in the semiconductor substrate. A conformal gate insulating layer 315 may be disposed between the line type active regions A and the gate electrodes G and IG. Hard mask patterns 330a may be disposed over the gate electrodes G and IG. LDD source/drain regions 335 may be disposed between the gate electrodes G and IG in the line type active regions A. Gate spacers 340 which surround sidewalls of the hard mask patterns 330a and the gate electrodes G and IG may be disposed. The gate spacers 340 may be a silicon nitride layer or a silicon oxide layer. High concentration source/drain regions 345 may be disposed between the adjacent gate spacers 340 in the line type active regions A.

According to the present invention, line type active regions are formed, and device isolation gate electrodes which are parallel to each other and intersect the line type active regions are formed. Here, the device isolation gate electrodes are constituted of recessed device isolation gate electrodes, and channel length can increase in comparison to a conventional technique by using recessed channels under the recessed device isolation gate electrodes, so that it is possible to improve reliability to a device isolation function. Alternatively, the device isolation gate electrodes are constituted of planar type device isolation gate electrodes of which a width is formed to be larger than a width of the device gate electrode, so that it is possible to enhance the device isolation function. Accordingly, it is possible to implement a semiconductor device having high integration degree and excellent device characteristics by using the line type active regions and the device isolation gates.

While this invention has been particularly shown and described with references to preferred embodiments thereof, it will be understood by those skilled in the art that various changes in form and details may be made herein without departing from the spirit and scope of the invention as defined by the appended claims. application.

What is claimed is:

1. A semiconductor device, comprising:
a device isolation layer which defines line type active regions in a semiconductor substrate; and
at least four gate electrodes of substantially uniform width which are disposed over the semiconductor substrate to be parallel to each other and wherein the at least four gate electrodes completely overlap and intersect one of the line type active regions,
wherein the gate electrodes include both a device gate electrode and planar type device isolation gate electrode,
wherein the widths of the gate electrodes are constant in length thereof, and
wherein a width of the planar type device isolation gate electrode is greater than a width of the device gate electrode.

2. The semiconductor device according to claim 1, wherein the at least four gate electrodes include two planar type device isolation gate electrodes and two device gate electrode.

3. The semiconductor device according to claim 2, wherein the two device gate electrodes are planar type device gate electrode.

4. The semiconductor device according to claim 2, wherein the two device gate electrodes are recessed device gate electrode.

5. A semiconductor device, comprising:
a device isolation layer which defines line type active regions in a semiconductor substrate; and
gate electrodes of substantially uniform width which are disposed over the semiconductor substrate to be parallel to each other and intersect the line type active regions,
wherein the gate electrodes include both a device gate electrode and a planar type device isolation gate electrodes,
wherein a width of the planar type device isolation gate electrode is greater than a width of the device gate electrode, and
wherein the width of the planar type device isolation gate electrode is on a same horizontal level with the width of the device gate electrode.

6. A semiconductor device, comprising:
device isolation regions defining active regions in a semiconductor substrate; and
at least four gate electrodes of substantially uniform width having at least two device gate electrodes and at least two device isolation gate electrodes,
wherein the at least four gate electrodes completely overlap and intersect both one of the device isolation regions and one of the active regions, widths of the device isolation gate electrodes are greater than widths of the device gate electrodes at a same horizontal level being in parallel to a surface of the semiconductor substrate.

7. The semiconductor device of claim 6, the device isolation regions and the active regions are parallel with each other.

8. The semiconductor device of claim 6, wherein the at least four gate electrodes diagonally intersect the device isolation regions and the active regions.

9. The semiconductor device of claim 6, wherein the at least four gate electrodes are adjacent to each other.

10. The semiconductor device of claim 6, wherein the two device gate electrodes are adjacent to each other, and wherein the two device isolation gate electrodes are disposed both sides of the two device gate electrodes.

11. The semiconductor device of claim 6, wherein the at least four gate electrodes are disposed at higher level than the surface of the semiconductor substrate.

12. The semiconductor device of claim 6, wherein the two device gate electrodes have extending portions in trenches of the semiconductor substrate.

* * * * *